(12) United States Patent
Ogihara et al.

(10) Patent No.: US 7,999,275 B2
(45) Date of Patent: Aug. 16, 2011

(54) COMPOSITE SEMICONDUCTOR DEVICE, LED HEAD THAT EMPLOYS THE COMPOSITE SEMICONDUCTOR DEVICE, AND IMAGE FORMING APPARATUS THAT EMPLOYS THE LED HEAD

(75) Inventors: Mitsuhiko Ogihara, Tokyo (JP);
Hiroyuki Fujiwara, Tokyo (JP);
Tomohiko Sagimori, Hachioji (JP);
Tomoki Igari, Hachioji (JP)

(73) Assignee: Oki Data Corporation, Tokyo (JP)

(*) Notice: Subject to any disclaimer, the term of this patent is extended or adjusted under 35 U.S.C. 154(b) by 377 days.

(21) Appl. No.: 11/739,709

(22) Filed: Apr. 25, 2007

(65) Prior Publication Data
US 2007/0252156 A1    Nov. 1, 2007

(30) Foreign Application Priority Data

Apr. 26, 2006 (JP) .................... 2006-121844

(51) Int. Cl.
*H01L 33/00* (2010.01)
(52) U.S. Cl. .......................................... 257/98; 257/99
(58) Field of Classification Search ............ 257/98–100; 347/238, 237
See application file for complete search history.

(56) References Cited

U.S. PATENT DOCUMENTS

| | | | |
|---|---|---|---|
| 6,476,551 B1 * | 11/2002 | Osawa et al. ................ 313/506 |
| 6,583,446 B1 | 6/2003 | Taninaka et al. | |
| 7,078,729 B2 | 7/2006 | Suzuki et al. | |
| 2003/0010989 A1 | 1/2003 | Yukimoto | |
| 2004/0173802 A1 | 9/2004 | Yukimoto | |
| 2007/0246718 A1 * | 10/2007 | Sagimori et al. ................ 257/88 |

FOREIGN PATENT DOCUMENTS

| | | |
|---|---|---|
| CN | 1595672 A | 3/2005 |
| EP | 1657739 A2 | 5/2006 |
| EP | 1699091 A2 | 9/2006 |
| JP | 59196272 A | 11/1984 |
| JP | 02082541 U | 6/1990 |
| JP | 09186367 | * 12/1995 |
| JP | 09-186367 A | 7/1997 |
| JP | 2002043635 A | 2/2002 |
| JP | 2004-179641 A | 6/2004 |
| JP | 2005159773 A | 6/2005 |
| WO | 2007113947 A1 | 10/2007 |

OTHER PUBLICATIONS

European Search Report dated May 11, 2010 concerning European Patent Application No. 07106857.1.
European Search Report dated dated Oct. 26, 2010.

* cited by examiner

*Primary Examiner* — Kiesha R Bryant
*Assistant Examiner* — Mark W Tornow
(74) *Attorney, Agent, or Firm* — Panitch Schwarze Belisario & Nadel LLP

(57) ABSTRACT

A composite semiconductor device includes a semiconductor thin film, a substrate, connection pads, and a light blocking layer. The semiconductor thin film includes light emitting elements. The driver circuits are formed on the substrate and the semiconductor thin film is fixed on the substrate, the driver circuit driving the light emitting element. The connection pads are formed on the substrate, electrical connection being made through which the connection pads. The light blocking layer is formed in an area between the light emitting element and the connection pad, the light blocking layer. The light blocking layer prevents light emitted from the light emitting element from reaching wires connected to the connection pad.

27 Claims, 29 Drawing Sheets

US 7,999,275 B2

COMPOSITE SEMICONDUCTOR DEVICE, LED HEAD THAT EMPLOYS THE COMPOSITE SEMICONDUCTOR DEVICE, AND IMAGE FORMING APPARATUS THAT EMPLOYS THE LED HEAD

BACKGROUND OF THE INVENTION

1. Field of the Invention

The present invention relates to a composite semiconductor device in which arrays such as LED arrays are combined with driver circuits, an LED print head that employs the composite semiconductor device, and an image forming apparatus that employs the LED head.

2. Description of the Related Art

Among conventional electrophotographic printers is one that incorporates an LED type exposing unit. An LED type exposing unit incorporates a plurality of LED array chips, each of which includes a plurality of light emitting diodes (LEDs).

Many printers of late are capable of printing not only characters but also images. Printing images with high resolution places great demands on printers, leading to increasing number of LEDs used in an exposing unit. This increases the array density of LEDs array chips and driver circuits incorporated in the exposing unit.

Japanese patent Laid-Open No 2004-179641 discloses one way of meeting these demands without mounting individual LED arrays and driver circuits on a printed circuit board. Driver circuits are formed on a semiconductor substrate, and LED array chips are bonded on the semiconductor substrate, thereby preparing a composite semiconductor device. The composite semiconductor devices are then mounted on a printed circuit board. Then, the composite semiconductors are electrically connected by bonding wires to the circuit board.

The composite semiconductor device of the aforementioned configuration suffers from the problem in that light emitting regions emit light not only in a direction in which the light should be emitted but also in other directions in which light should not be emitted. The light emitted in unwanted directions may be reflected by, for example, bonding wires, disturbing an electrostatic latent image formed by the LED print head.

SUMMARY OF THE INVENTION

The present invention was made to solve the aforementioned problems.

An object of the invention is to provide a composite semiconductor device in which light emitted by the light emitting regions and reflected by objects surrounding the light emitting regions does not disturb the light normally emitted through a light emitting surface of the composite semiconductor device.

An object of the invention is to provide an LED print head that employs the composite semiconductor device.

Still another object is to provide an image forming apparatus that employs the LED print head.

A composite semiconductor device includes a semiconductor thin film, a substrate, connection pads, and a light blocking layer. The semiconductor thin film includes light emitting elements. The semiconductor thin film and a driver circuit are mounted on the substrate, the driver circuit driving the light emitting element. The connection pads are formed on the substrate, electrical connection being made through which the connection pads. The light blocking layer is formed in an area between the light emitting element and the connection pad. The light blocking layer prevents light emitted from the light emitting element from reaching wires connected to the connection pad.

A composite semiconductor device includes a plurality of light emitting portions aligned in a direction. The composite semiconductor device includes a semiconductor thin film, a light blocking layer, and a connection pad. The semiconductor thin film includes light emitting elements having first conductive contacts and second conductive contacts for the light emitting elements are formed. The light blocking layer blocks light emitted from the light emitting portions. The connection pad is connected to an external circuit. The light blocking layer includes an edge extending in the vicinity of the light emitting elements and preventing light emitted from the light emitting elements from being reflected by a reflective object formed on the composite semiconductor device.

A composite semiconductor device includes a plurality of light emitting portions aligned generally in a row. The composite semiconductor device includes a semiconductor thin film, a light blocking layer, and a connection pad. The semiconductor thin film includes light emitting elements having first conductive contacts and second conductive contacts for the light emitting elements are formed. The light blocking layer blocks light emitted from the light emitting elements in a direction. The connection pad is connected to an external circuit. The light emitting elements are aligned in a direction such that each of the light emitting elements is shifted in its position by a distance in the direction (X) with respect to the position of the adjacent light emitting element, i.e., displaced ahead of a preceding one in the direction. The light blocking layer includes an edge in the vicinity of the light emitting elements such that the edge portion is shifted in its position by a distance in the direction (X) with respect to the position of the adjacent light emitting element, i.e., displaced ahead of a preceding one in a direction transverse to the direction.

A composite semiconductor device includes a substrate and a smoothing film for smoothing a surface of the substrate. A semiconductor thin film includes a light emitting element formed therein, the semiconductor thin film being formed in contact with the smoothing film. A light blocking portion has a height such that the light blocking portion blocks light emitted in directions outside of an angular range in which a most amount of the light emitted from the light emitting elements. The smoothing film has a thickness in the range of 1 to 2 µm.

An LED print head incorporates a plurality of semiconductor composite devices as described above. A support (1202e) supports the plurality of semiconductor composite devices. A rod lens array focuses light emitted from the light emitting element on an external object. The light emitting element is a light emitting diode.

An image forming apparatus incorporates the aforementioned LED print head. The image forming apparatus includes an image bearing body, an exposing unit, and a developing unit. The exposing unit selectively illuminates a charged surface of the image bearing body to form an electrostatic latent image on the surface. The developing unit develops the electrostatic latent image to form a visible image on a print medium.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limiting the present invention, and wherein.

DETAILED DESCRIPTION OF THE INVENTION

The present invention will be described with reference to the accompanying drawings.

First Embodiment

Figure 1:
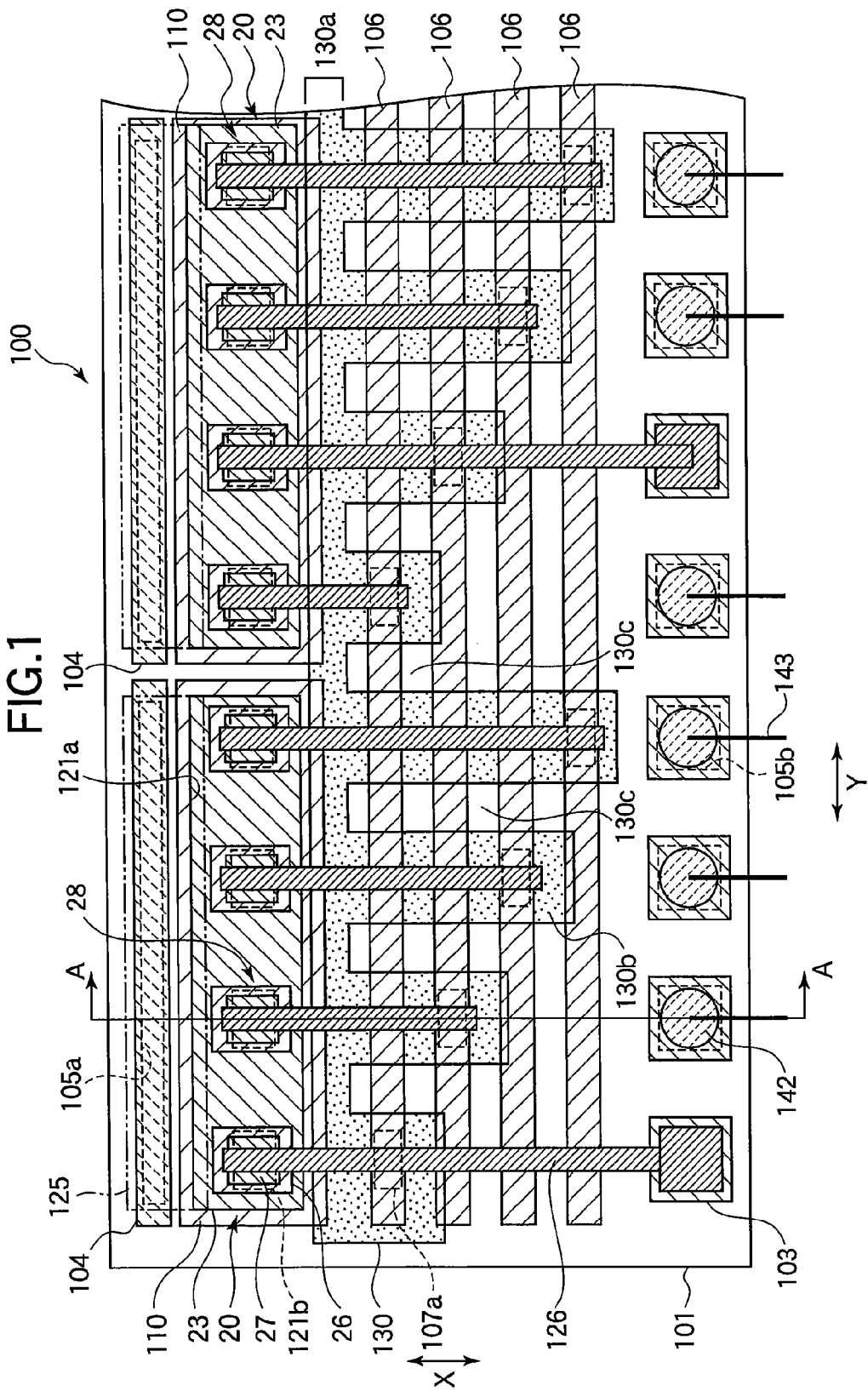
FIG. 1 is a top view of a composite semiconductor device of a first embodiment.

FIG. 1 is a top view of a composite semiconductor device 100 of a first embodiment illustrating a pertinent portion.

Figure 2:
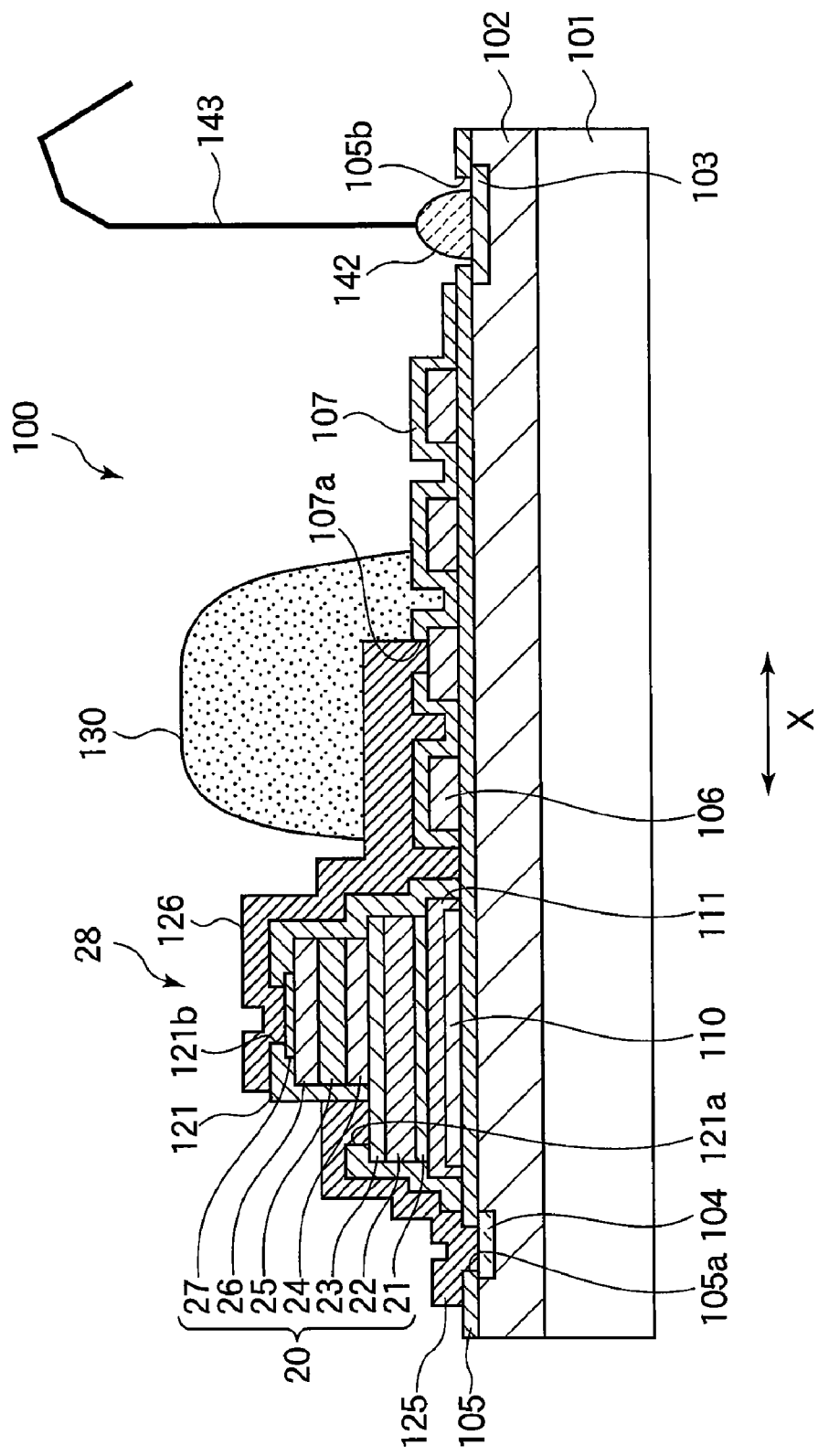
FIG. 2 is a cross-sectional view taken along a line A-A of FIG. 1.

FIG. 2 is a cross-sectional view taken along a line A-A of FIG. 1. For simplicity's sake, interlayer dielectric film layers 105, 107, and 121 and a smoothing layer 111, which will be described later, are omitted from FIG. 1.

Referring to FIG. 2, the composite semiconductor device 100 includes driver circuits formed on a substrate (e.g., Si) 101. An integrated circuit/multilayer interconnection region 102 is defined on the substrate 101. Connection pads 103 for wirings and an interlayer dielectric film layer 105 having openings formed at specific locations are formed on the surface of the integrated circuit/multilayer interconnection region 102.

A plurality of metal layers 110 are formed at a widthwise end portion of the composite semiconductor device 100, and are aligned in an end-to-end arrangement in a longitudinal direction of the composite semiconductor device 100. Referring to FIG. 2, the smoothing layer 111 on which a semiconductor thin film 20 is bonded is formed to cover the metal layer 110. The semiconductor thin film 20 includes light emitting elements and is bonded on the smoothing layer 111. The integrated circuit formed in the integrated circuit/multilayer interconnection region 102 includes driver circuits that drive light emitting elements. The connection pads 103 are used for feeding electric power to the light emitting elements. The wire bonding pad 142 are used for feeding electric power to the integrated circuit and for receiving drive signals. The light emitting elements are, for example, light emitting diodes (LEDs).

The semiconductor thin film 20 includes a bonding layer 21 of n-type GaAs, a conductive layer 22 of n-type $Al_tGa_{1-t}As$, an n-type contact layer 23 of n-type GaAs, a lower cladding layer 24 of n-type $Al_zGa_{1-z}As$, an n-type active layer 25 of n-type $Al_yGa_{1-y}As$, an upper cladding layer 26 of n-type $Al_xGa_{1-x}As$, and a p-type contact layer 27 of p-type GaAs, aligned in this order from bottom to top.

The semiconductor thin film 20 may be formed of a single crystal semiconductor such as GaN, InGaN, AlGaN, AlN, AlInN, AlGaInP, AlGaAsP, or InP. The semiconductor thin film 20 may also be made of organic semiconductor materials.

Referring to FIG. 2, an upper structure includes the lower cladding layer 24, n-type active layer 25, upper cladding layer 26, and p-type contact layer 27. A lower structure includes the bonding layer 21, conductive layer 22, and n-type contact layer 23. The upper structure includes a plurality of island-shaped elements that are electrically isolated from one another, and that are aligned in the longitudinal direction of the composite semiconductor device 100. The active layer 25 is a portion that actually emits light. In this specification, the term light emitting element 28 means a portion that includes the island-shaped multilayer structure and emits light. The term "light emitting device" means the device portion including the thin film structure depicted by 20 and the n-type and p-type electrodes. The light emitting element 28 emits light in all directions. The light emitted through the top surface of the light emitting element 28 is used when the light emitting element 28 is applied in the LED print head. The light emitted toward a back surface of the semiconductor thin film 20 is reflected by the metal layer 110 back to the front surface of the semiconductor thin film 20, thereby improving light emitting efficiency for the light source of the LED print head.

Connection region pads 104 are aligned along the row of the semiconductor thin films 20, and are connected to the integrated circuits. A plurality of common wires 106 are formed in a widthwise middle area of the composite semiconductor device 100, extend in parallel to one another in the longitudinal direction of the composite semiconductor device 100. The semiconductor thin film 20 and common wires 106 are covered with the interlayer dielectric film layers 121 and 107. FIG. 1 does not shown the interlayer dielectric film layers 121 and 107 but shows openings (dotted lines) formed in the interlayer dielectric film layers 121 and 107.

A wiring/connection metal 125 electrically connects the n-type contact layer 23 to the connection region pad 104 via an opening 105$a$ formed in the interlayer dielectric film layer 105 and an opening 121$a$ formed in the interlayer dielectric film layer 121. A p-type side contact metal 126 electrically connects the p-type contact layer 27 of the respective light emitting portion 28 to a corresponding common wire 106 via an opening 121$b$ formed in the interlayer dielectric film layer 121 and an opening 107$a$ formed in the interlayer dielectric film layer 107. A p-type side electrode serves as an individual electrode for the light emitting portion 28 and an n-type side electrode serves as a common electrode for each of blocks each of which includes four light emitting portions 28 (FIG. 1). Wire bumps 142 are formed on the connection pads 103 through openings 105$b$ formed in the interlayer dielectric film layer 105, thereby electrically connecting the connection wires 143 to the connection pads 103.

A light blocking layer 130 may be an insulating layer formed of, for example, an organic film. A light blocking layer 130 has a large film stress, which may cause the semiconductor thin film layer to peel off from the substrate. In order to avoid such effects, the light blocking layer 130 covers only a minimum area necessary to block light of the LED for reflection at the wire 143 as shown in FIG. 1 and not the entire area between the light emitting region and the connection pads 103. The light blocking layer 130 includes a belt shaped portion 130$a$, extended portions 130$b$, and slits 130$c$. The belt shaped portion 130$a$ extends adjacent the light emitting elements 28 in parallel to the row of the light emitting elements 28. The extended portions 130$b$ extend from the belt shaped portion 130$a$ away from the light emitting elements 28 defining the slits 130 between the adjacent extended portions 130$b$. The extended portions 130$b$ preferably completely cover the connection of the common wires 106 and the p-type side contact metal 126, the connection being formed in the opening 107$a$ formed in the interlayer dielectric film layer 107.

Figure 3:
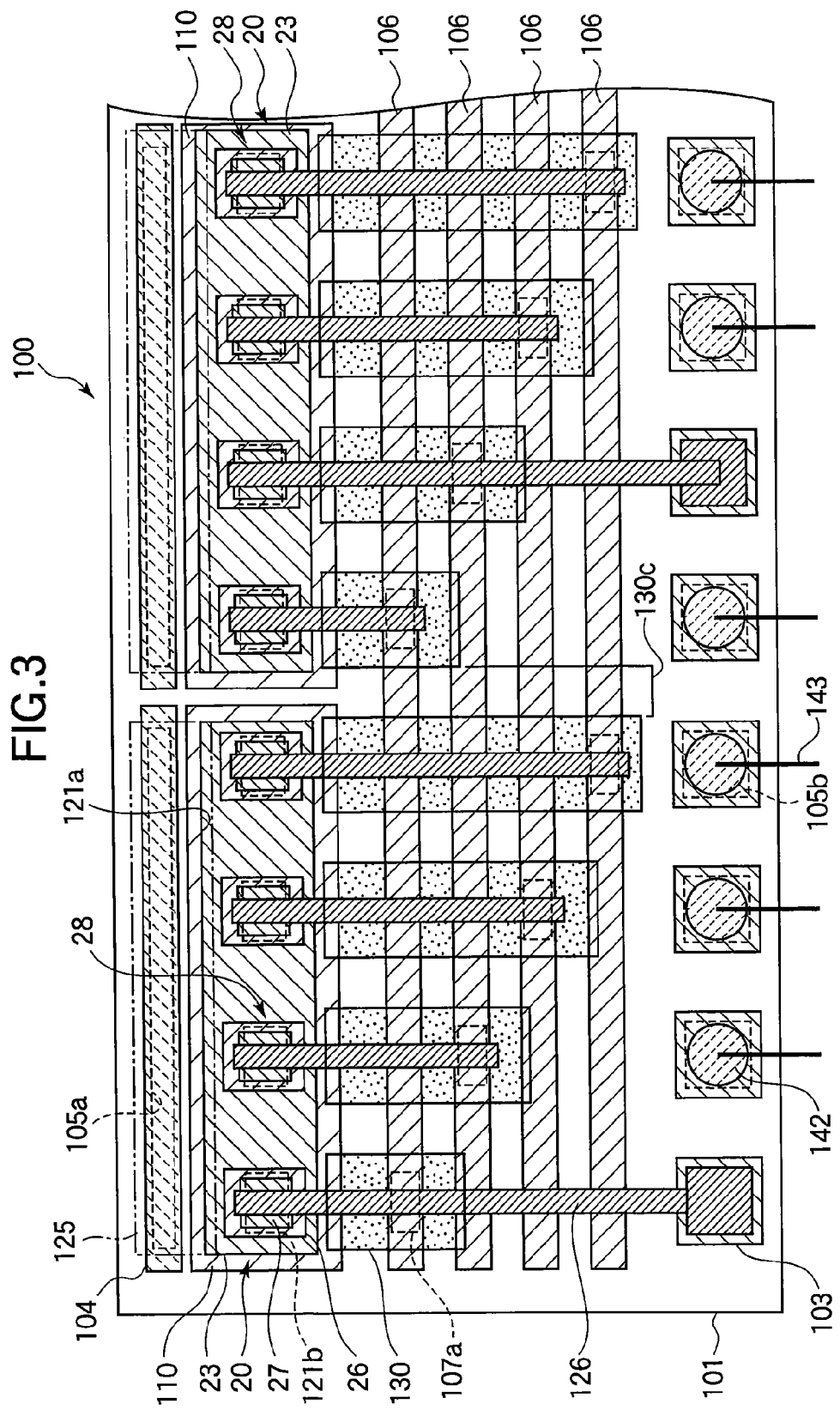
FIG. 3 illustrates the function of the light blocking layer.

FIG. 3 illustrates the function of the light blocking layer 130.

Experiment reveals the following fact. As shown in FIG. 3, if the slits 130$c$ extend completely through the belt-shaped portion 130$a$ to divide the belt-shaped portion 130$a$ into a plurality of sub sections, the light would reach the connection wires 143 through gaps between the sub sections and would be reflected by the connection wires 143. For this reason, the belt-shaped portion 130$a$ is required to extend all the way from one endmost light emitting element 28 to another endmost light emitting element 28 on the composite semiconductor device 100.

Figure 4:
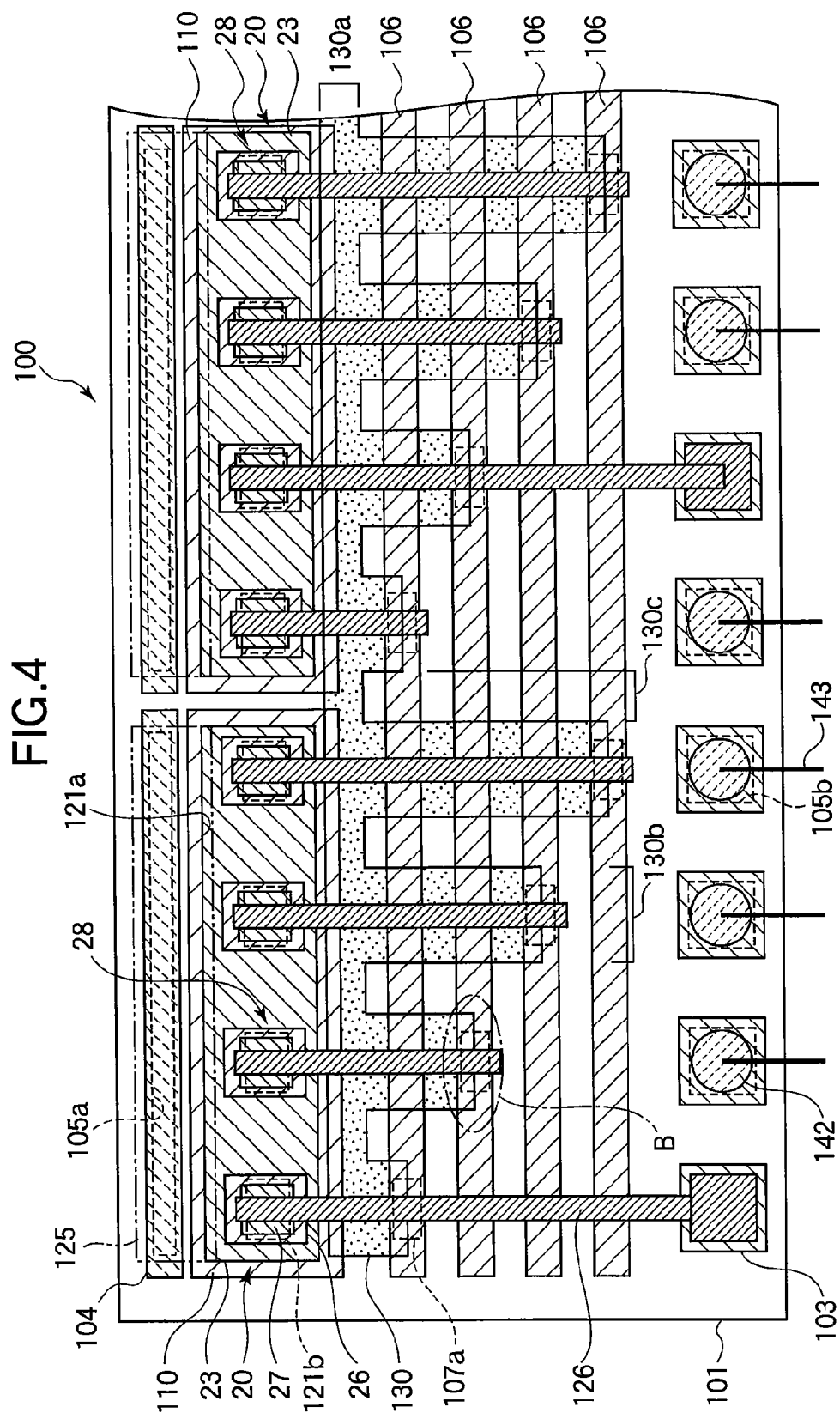
FIG. 4 illustrates anther example of the function of the light blocking layer.

FIG. 4 illustrates anther example of the function of the light blocking layer 130.

Another experiment shows the following fact.

If the free end portion of the extended portion 130$b$ does extend to cover an area where the common wires 106 are connected to a p-type side contact metal 126 through the opening 107$a$ formed in the interlayer dielectric film layer as shown in an area B depicted by dot-dashed lines in FIG. 4, the light does not reach the connection wire 143 but is reflected to become noise before it reaches the connection wire 143.

Figure 5:
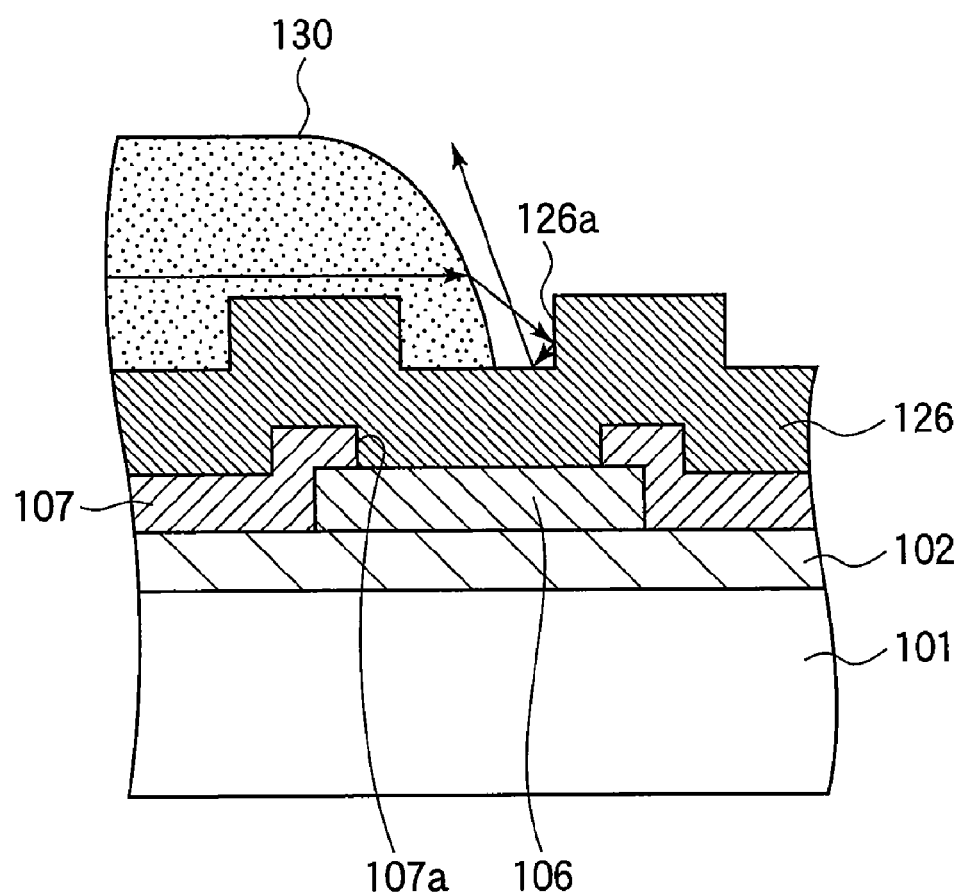
FIG. 5 is an enlarged cross-sectional view of a vicinity of the opening formed in the interlayer dielectric film layer.

FIG. 5 is an enlarged cross-sectional view of a vicinity (indicated by dot-dashed lines) of the opening 107$a$ formed in the interlayer dielectric film layer 107, illustrating the causes of the aforementioned noise. The light transmitted through the light blocking layer 130 is reflected by the side surfaces and bottom surface of a recess 126$a$ formed in the p-type side contact metal 126 in the opening 107$a$, and is then outputted toward the front surface of the composite semiconductor device 100. Therefore, the extended portion should not end before an area where recesses and projections that are exposed in the opening 107$a$ but extend to over these recesses and projections.

Figure 6:
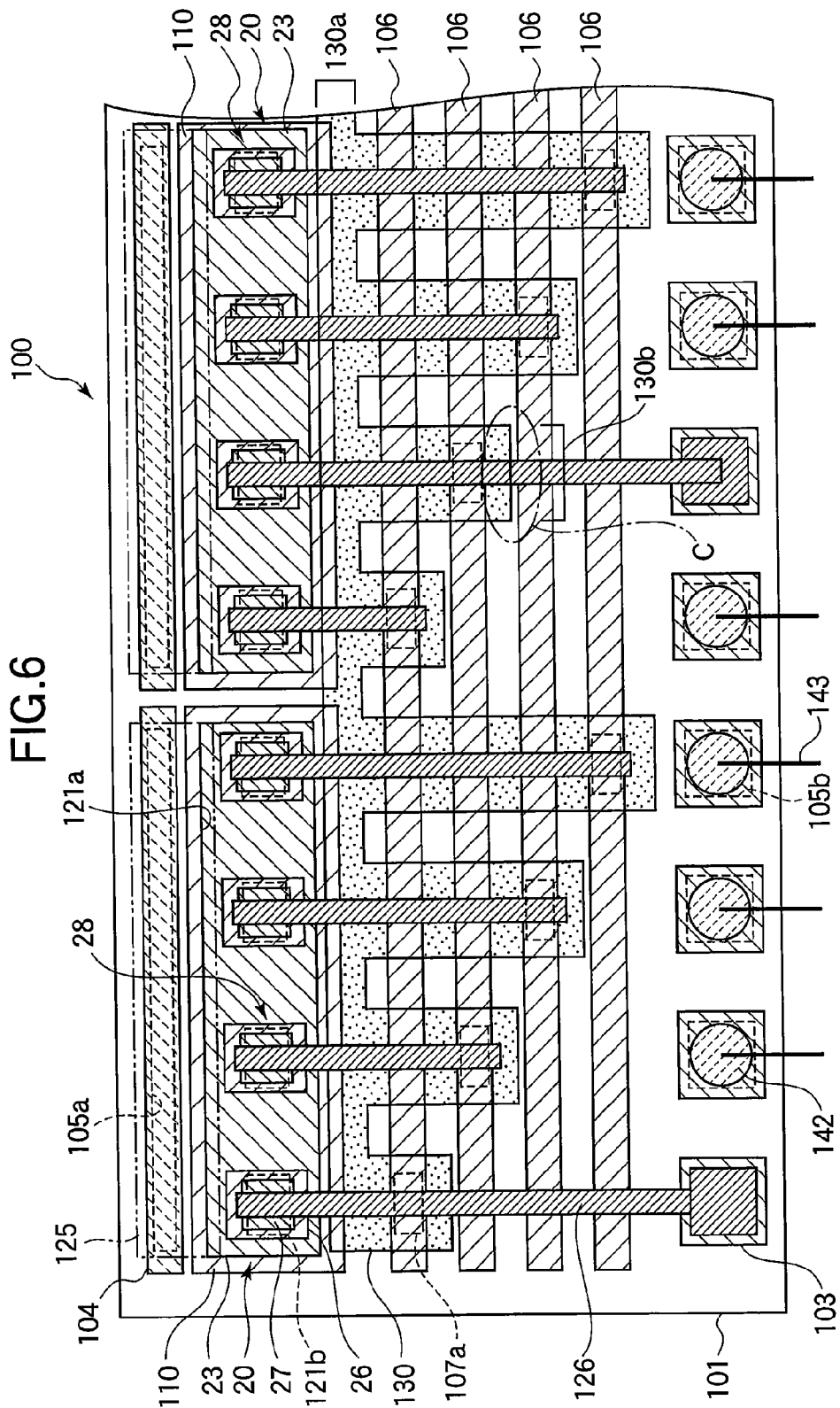
FIG. 6 illustrates noise due to another reason.

FIG. 6 illustrates light reflection due to another reason. For example, the p-type side contact metal 126 has a high reflection coefficient, and extends over a stepped portion in a region C shown by dot-dashed lines in FIG. 6. Thus, the light blocking layer 130 should extend to cover the p-type side contact metal 126 at least not covered by any dielectric film. In other words, the light blocking layer 130 should not end just before locations where highly reflective materials extending over recesses and projections are exposed through openings (e.g., openings 107$a$).

Figure 7:
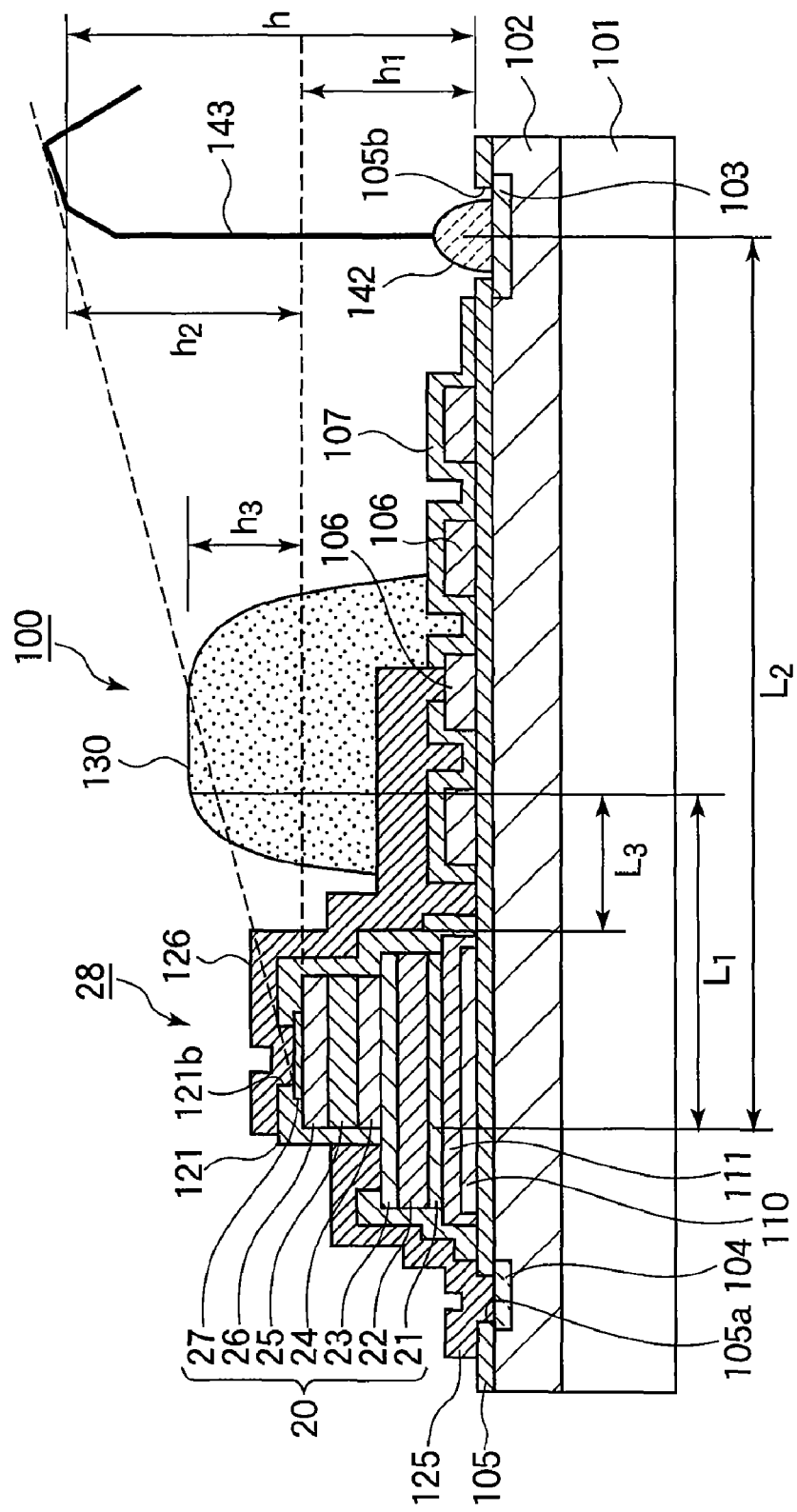
FIG. 7 illustrates the shape of the light emitting region, light blocking layer, and connection wire, and the positional relation among them.

FIG. 7 illustrates the shape of the light emitting region (i.e., n-type active layer 25), light blocking layer 130, and connection wire 143, and the positional relation among them. The light blocking layer 130 has a certain height so that the light blocking layer 130 blocks light emitted from the light emitting element in directions outside of a certain angular range in which a most amount of the light emitted from the light emitting elements.

Referring to FIG. 7, parameters are defined as follows:

L1: A distance between a side surface of the n-type active layer 25 opposite the connection wire 143 and a position where the light blocking layer 130 is highest and is as close to the n-type active layer 25 as possible L2: A distance between the connection wire 143 and a side surface of the n-type active layer 25 opposite the connection wire 143 h: A maximum local height of the connection wire 143 above the interlayer dielectric film layer 105 at a location as close to the light emitting element 28 as possible when the connection wire 143 is seen from the top of the light emitting element 28 h1: A maximum height of the light emitting element 28 above the interlayer dielectric film layer 105 h2: The difference between h1 and h h3: The difference between h1 and a maximum height of the light blocking layer 130 above the interlayer dielectric film layer 105

In order that the light blocking layer 130 prevents the light emitted from the light emitting element 28 from reaching the connection wire 143, h3 should be selected such that h3/L1>h2/L2.

When the connection wire 143 is formed to have as small a height (i.e., h) as possible, the height h is h≈100±50 μm. The height h1 is 4>h1>0 μm depending on the thickness of the semiconductor thin film 20, and the integrated circuit/multi-layer interconnection region 102, and the substrate 101.

Because h is much greater than h1, h and h2 are related such that h≈h2. Thus, the relation of h3/L1>h/L2 should be met. The distance L2 may be in the range of 100 to 200 μm, depending on the design of the driver circuits.

Experiment shows that if the light blocking layer 130 extends to overlap the light emitting element 28, the light emitted from the light emitting element 28 directly enters the light blocking layer 130 so that a larger amount of light transmits through the light blocking layer 130 to reach the connection wire 143. This increases the chance of the light being reflected by the connection wire 143. For this reason, the light blocking layer 130 should not extend to overlap the light emitting element 28. The top surface of the light emitting element 28 may have a variety of size depending on the design. For example, if the composite semiconductor device 100 takes the form of a light emitting diode array as a light source for a printer, the dimension of the light emitting element 28 in a direction of the width of the composite semiconductor device 100 may be in the range of 5 to 20 μm.

Assume that L1, h2, and l2 are as follows:
L1 (min)=5 μm
L1 (max)=20 μm
L2 (max)=200 μm
h2 (min)≈h (min)=50 μm
Then, for L1 (min), h3 (min) is given by $$h3\,(\text{min}) = h\,(\text{min}) \times L1\,(\text{min}) / L2\,(\text{max})$$
$$= 50\,\mu m \times 5\,\mu m / 200\,\mu m$$
$$= 1.25\,\mu m$$

For L1 (max), h3 (min) is given by $$h3\,(\text{min}) = h\,(\text{min}) \times L1\,(\text{max}) / L2\,(\text{max})$$
$$= 50\,\mu m \times 20\,\mu m / 200\,\mu m$$
$$= 5\,\mu m$$

For a print resolution of 600 dpi (spacing between dots is approximately 42.3 μm), the top surface of the light emitting element 28 should have a size of 20 μm. Thus, for a print resolution of 600 dpi, h1 (min) is set to 0, the thickness of the light blocking layer 130 is preferably equal to or more than 5 μm. For a print resolution of 2400 dpi, the thickness of the light blocking layer 130 is preferably equal to or more than 1.2 μm if the top surface of the light emitting element 28 is to be 5 μm.

When h3=5 μm,
if h2≈h=h(max)=150 μm and L2(min)=100 μm, the L3 (max) is given by $$L3\,(\text{max}) = \{h3 / h\,(\text{max})\} \times (L2\,(\text{min}) - L3\,(\text{max}))$$
$$\approx \{5\,\mu m / 150\,\mu m\} \times 100 \times \mu m$$
$$= 3.3\,\mu m$$

where L3 is a distance between a side of the light emitting element closer to the light blocking layer 130 and a position at which the light blocking layer 130 is highest. It is to be noted that L2>>L3.

If L3=5 μm is desirable, h3 may be h3=7.5 μm. When the light blocking layer is to be formed of an organic film, the thickness larger than 10 μm is difficult to achieve by photolithography. Moreover, a thickness of 10 μm exerts a large film stress to the chip. Assuming that the effective upper end h3eff (max) of the thickness of the light blocking layer 130 that can be achieved is h3eff (max)=10 μm, then the effective maximum distance L3eff(max) is L3eff (max) is L3eff(max) =6.6 μm. In other words, when the light blocking layer is to be formed in the vicinity of the light emitting element 28, the distance between the light emitting element 28 and the light blocking layer 130 is equal to or less than 6.6 μm≈7 μm.

The light blocking layer 130 may be formed of a thermosetting polymer or a UV curing polymer. Such materials include polyphenylsulfide, polysulfone, polyethersulphone (PES), polystyrene, polyacetal, polyethyleneterephthalate, poly buthylene terephthalete, amorphous polyester, liquid crystal polyester, polyaryletheretherketone, polyimide, and fluoroplastic.

Further, the light blocking layer 130 may also be formed of a material such as phenolic resin, epoxy resin, Unsaturated polyester resin (UP), alkyd resin, urethane resin or silicone resin, which contains a polymer.

Still further, the light blocking layer 130 may also be formed of a material such as high density polyethylene (HDPE) polypropylene, polyimide or crystalline polymer.

Further, the light blocking layer 130 may be formed of a material that becomes black after curing. A black light blocking layer completely blocks light. Thus, use of a black light blocking layer alleviates the aforementioned design requirements. For example, the light blocking layer may overlap if light emitting efficiency is not of prime importance. Alternatively, if light emitting efficiency is not of prime importance, the extended portion 130b of the light blocking layer 130 may end before it reaches a region in the opening 107a of the interlayer dielectric film layer 107 (FIG. 4) in which the common wire 106 and the p-type side contact metal 126 are connected together. Still alternatively, the extended portion 130b of the light blocking layer 130 may end before it reaches a region (FIG. 6) in which a highly reflective material such as metal wires (e.g., p-type side contact metal 126) extends over stepped portions.

If the light blocking layer 130 is formed of a thermosetting material, the light blocking layer 130 is preferably cured at a low temperature so that the stress exerted on the chip by the light blocking layer 130 may be alleviated. Polyimide cures at a temperature approximately in the range of 350-400° C. Experiment reveals that if the light blocking layer of polyimide is formed at the final stage of the chip manufacture, the curing temperature of the light blocking layer may be lowered to 300° C. Thermosetting polymers other than polyimide may have a curing temperature equal to or less than 300° C., for example, 200° C.

The semiconductor thin film 20 has been described with respect to one formed of a material containing AlGaAs. The semiconductor thin film 20 may also be formed of other material such as nitride semiconductor, mixed crystal semiconductors which consist of three elements or four elements (a ternary material or a quaternary material. The light emitting element may be formed by doping or mesa etching. While the light blocking layer 130 has been described with respect to one having an inclined side surface, the side surface may have any shape depending on the design. For example, the side surface may be vertical or overhanging.

Allowing the light blocking layer 130 to cure at a temperature equal to or lower than 300° C. reduces stress exerted on the chip.

Figure 8:
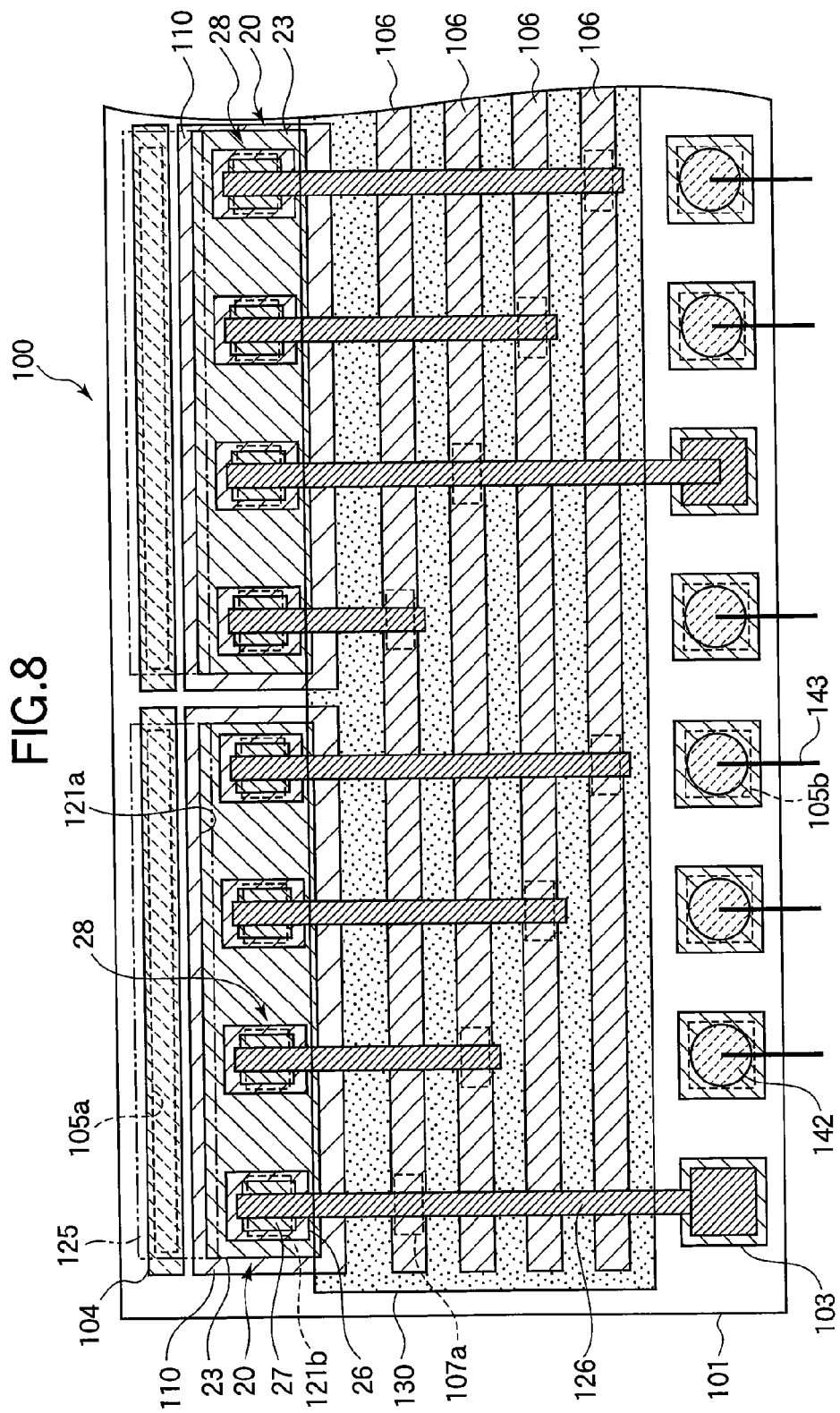
FIG. 8 illustrates a modification to the first embodiment.

FIG. 8 illustrates a modification to the first embodiment. As shown in FIG. 8, the light blocking layer 130 may extend over entire area between the light emitting elements 28 and the connection pads 103 without slits 130c (FIG. 1). The first embodiment has been described with respect to the semiconductor thin film 20 that is bonded on the substrate. Instead, the semiconductor thin film may be formed by allowing semiconductor epitaxial layers to grow directly on an Si substrate.

As described above, a light blocking layer is formed in the vicinity of a light emitting element 28, and the light blocking layer has a height sufficient to block the light emitted from the light emitting element. The light blocking layer is allowed extend over a wide enough area. Thus, the light blocking layer effectively prevents the light emitted from the light emitting element from being reflected by connection wires or other reflective structures on the composite semiconductor device to become noise while not exerting stress on the chip. Use of a black light blocking layer is more effective in blocking the light emitted from the light emitting element. A light blocking layer formed of a material that cures at a temperature not higher than 300° C. exerts less stress on the chip.

Second Embodiment

Figure 9:
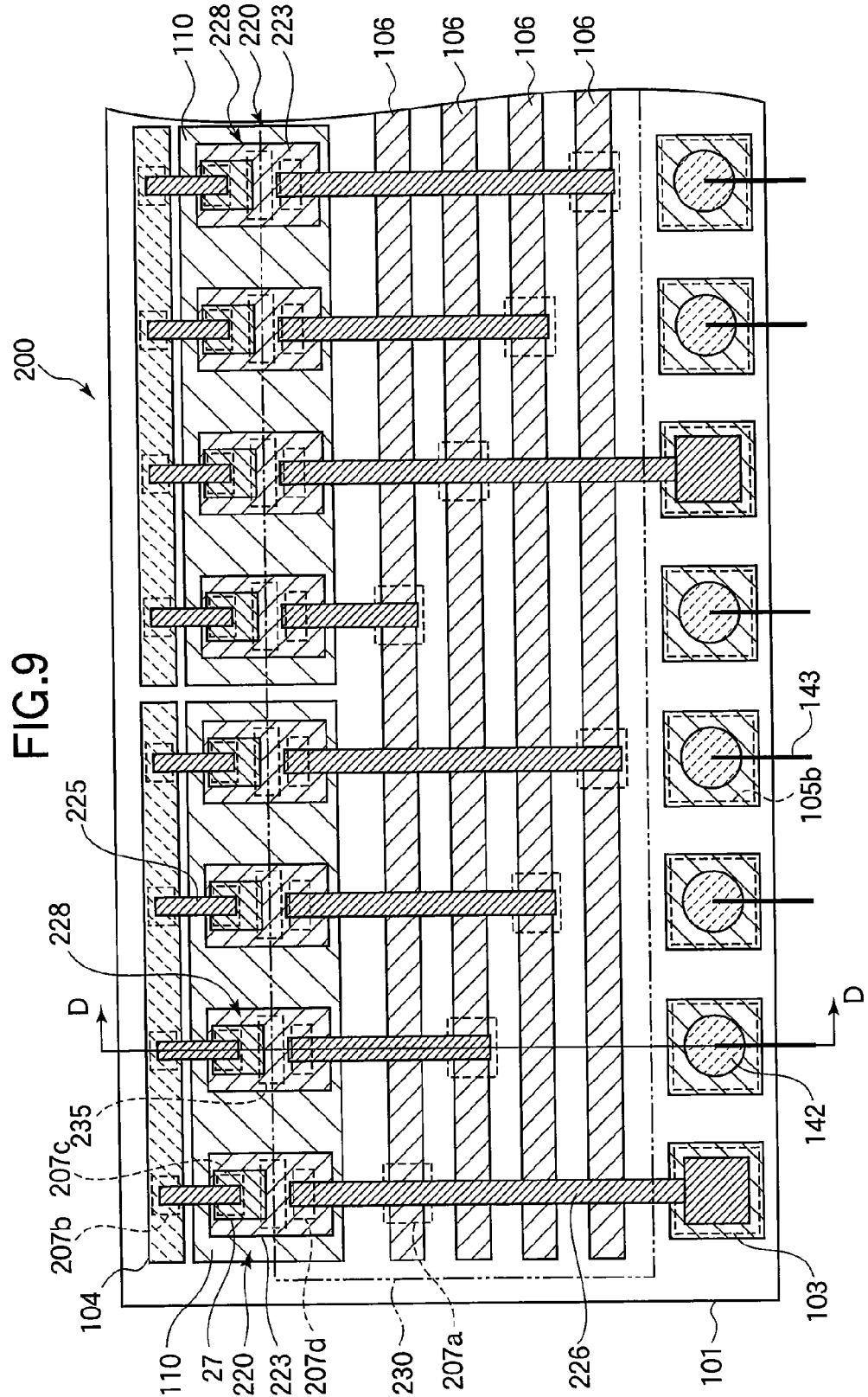
FIG. 9 is a top view illustrating a pertinent portion of a composite semiconductor device of a second embodiment.
Figure 10:
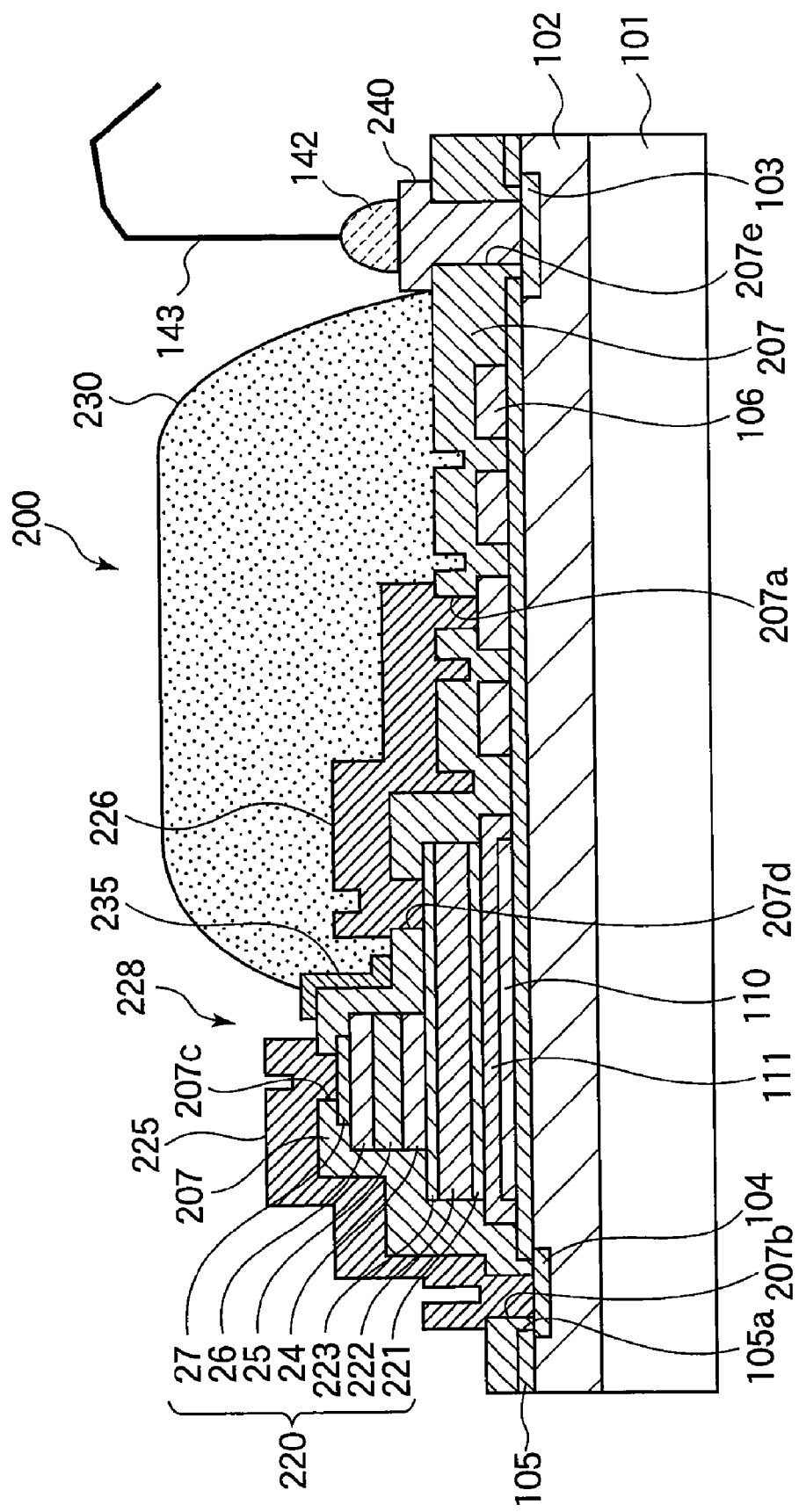
FIG. 10 is a cross-sectional view taken along a line D-D of FIG. 9.

FIG. 9 is a top view illustrating a pertinent portion of a composite semiconductor device 200 of a second embodiment. FIG. 10 is a cross-sectional view taken along a line D-D of FIG. 9. For simplicity's sake, interlayer dielectric film layers 105 and 107 are omitted from FIG. 9 and only openings formed in the interlayer dielectric film layers 105 and 107 are indicated by dotted lines.

The composite semiconductor device 200 differs from the composite semiconductor device 100 of the first embodiment in that opaque films (e.g., metal) 235 are formed between the light emitting element and the light blocking layer 230. The opaque film 235 is opaque to the wavelength of the light emitted from the light emitting element. Thus, composite semiconductor device 200 differs from the composite semiconductor device 100 in the configuration of the semiconductor thin film and its wiring. Elements equivalent to those of the first embodiment are given the same reference numerals and their description is omitted.

Referring to FIGS. 9 and 10, an upper structure includes a lower cladding layer 24, an n-type active layer 25, an upper cladding layer 26, and a p-type contact layer 27. A lower structure includes a bonding layer 221, a conductive layer 222, and an n-type contact layer 223. The upper structure includes a plurality of island-shaped elements that are electrically isolated from one another, and that are aligned in the longitudinal direction of the composite semiconductor device 200. The lower structure also includes a plurality of island-shaped elements that are electrically isolated from one another, and that are aligned in the longitudinal direction of the composite semiconductor device 200. The lower structure occupies a larger area than the upper structure such that the upper structure sits within the perimeter of the lower structure. Isolated light emitting elements 228 are driven electrically independently of one another.

Metal wires 225 extend through openings 207b and 207c to connect the p-type contact layers 27 of the respective light emitting elements 228 to connection region pad 104 for each block. An n-type side contact metal 226 extends through openings 207d and 207a to connect an n-type contact layer 223 of the respective light emitting elements 228 and corresponding common wires 106. A p-type side electrode of the light emitting element 228 functions as a common electrode for each block of light emitting elements 228, and an n-type side electrode of the respective light emitting element 228 functions as an individual electrode.

Referring to FIG. 10, a pad covering metal layer 240 is formed in an opening 207e formed in an interlayer dielectric film 207. A wire bump 142 is formed on the pad covering metal layer 240. The wire bump 142 connects the connection wire 143 to the connection pad 103 through the pad covering metal layer 240.

A light blocking layer 230 is formed to cover an entire area between the light emitting element of a semiconductor thin film 220 and the pad covering metal layers 240. The opaque film (e.g., metal) 235 is formed between each light emitting element 228 and the light blocking layer 230. The opaque film 235 is formed on the interlayer dielectric film 207 to extend to overlap part of the light emitting element or part of the inclined surface of the light emitting element, thereby preventing the light emitted from the light emitting element 228 from directly entering the light blocking layer 230. The opaque film 235 may be formed of a material containing Al or Au, i.e., Ti/Pt/Au, Cr/Au, Ni/Au, Ti, Ni, Ni/Al, or Al. The interlayer dielectric film 207 may be formed of inorganic film such as SiN or an organic film.

If the light blocking layer 230 overlaps the semiconductor thin film 220, the bonding strength of the semiconductor thin film 220 to its base, i.e., a smoothing layer 111, is particularly important. When a semiconductor thin film is to be bonded by intermolecular force, the higher the flatness of the surfaces, the more intimately the surfaces are attached to each other. The steps and differences in the height of peaks and valleys due to surface topology are reduced by, for example, the smoothing layer 111. Experiment reveals that use of the smoothing layer 111 is effective in reducing the difference in the height of peaks and valleys but the flatness of the surface of semiconductor is not improved any further after the smoothing layer 111 reaches a certain thickness.

Experiment shows that the smoothing film 111 reduces the peaks and valleys by a factor of 10. Increasing the thickness of the smoothing film 111 or using a multilayer structure of the smoothing film 111 does not improve the flatness of the surface of semiconductor any further. In other words, the smoothing effect of the smoothing film 111 highly depends on the surface roughness of a based on which the smoothing film 111 is formed.

Experiment shows that if the difference between the height of peaks and valleys is equal to or less than 20 nm after the smoothing layer 111 is formed, then the semiconductor thin film 220 remains intimately attached to the smoothing film 111, so that reliable bonding is achieved. For example, the smoothing film 111 of polyimide was formed on the surface of a driver/multiplayer interconnection 102 having peaks and valleys of 200 nm. Bonding effect was evaluated for various thickness of the smoothing film 111 in the range of 0.7 to 2 μm. The thickness of the smoothing film 111 larger than 1 μm showed good bonding strength between the semiconductor thin film 220 and the smoothing film 111. In other words, the thickness of the smoothing film 111 is preferably greater than 1 μm and equal to or smaller than 2 μm.

For a thickness equal or more than 1.3 μm, the high bonding strength was obtained over the entire surface of the wafer. Such a high bonding strength eliminates the chance of defects such as film crack appearing in the semiconductor thin film 220 when the light blocking layer 230 overlaps the semiconductor thin film 220. Of course, high bonding effect of the semiconductor to the smoothing film 111 is always desirable irrespective of the types of the light blocking layer. Therefore, when a light blocking layer of different types from the aforementioned light blocking layer is employed or even when a light blocking layer is not required, it is most preferable to select the range of thickness of the smoothing layer that provides high bonding force.

The opaque film 235 may have any thickness as long as the opaque film 235 effectively blocks the light emitted from the light emitting regions. For example, the thickness may be equal to or greater than 10 nm. Forming the opaque film 235 on a side surface of the light blocking layer 230 facing the light emitting regions makes it difficult for the light to enter the light blocking layer 230. Thus, the light blocking layer 230 may be formed to overlap the light emitting element. In other words, the light blocking layer 230 may be formed to extend very close to the light emitting region.

If the light blocking layer 230 overlaps the light emitting element and the opaque film 235 is not formed, the light emitted from the light emitting element directly enters the light blocking layer 230, so that the light transmits through the light blocking layer 230 to reach the connection wires 143 formed on the pad covering metal layer 240.

As described above, the opaque film 235 prevents the light from transmitting through the light blocking layer 230. Because the light blocking layer may be formed to overlap the light emitting element or very close to the light emitting region, the light blocking layer 230 may have a smaller thickness.

Third Embodiment

Figure 11:
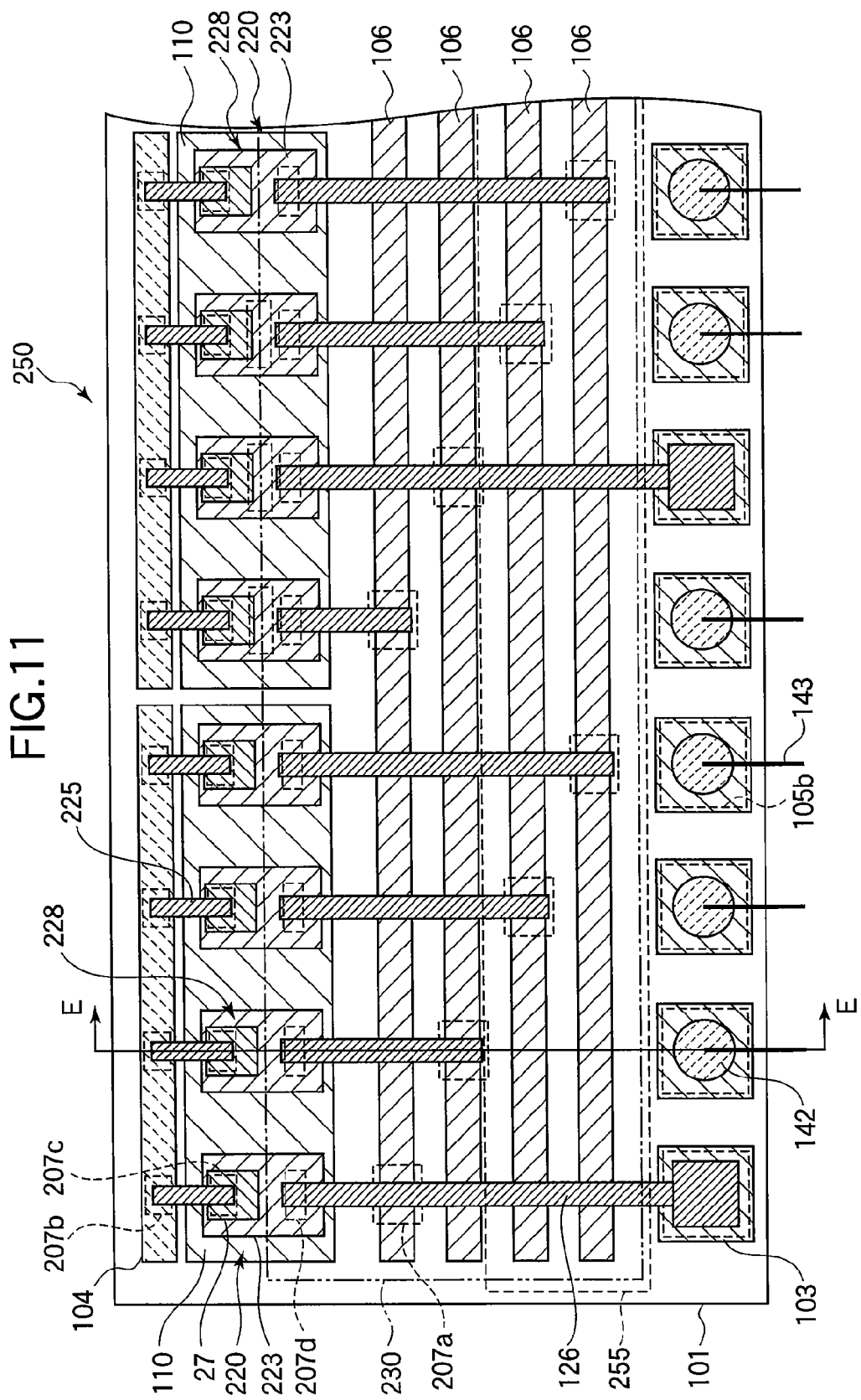
FIG. 11 is a top view of a composite semiconductor device of a third embodiment.
Figure 12:
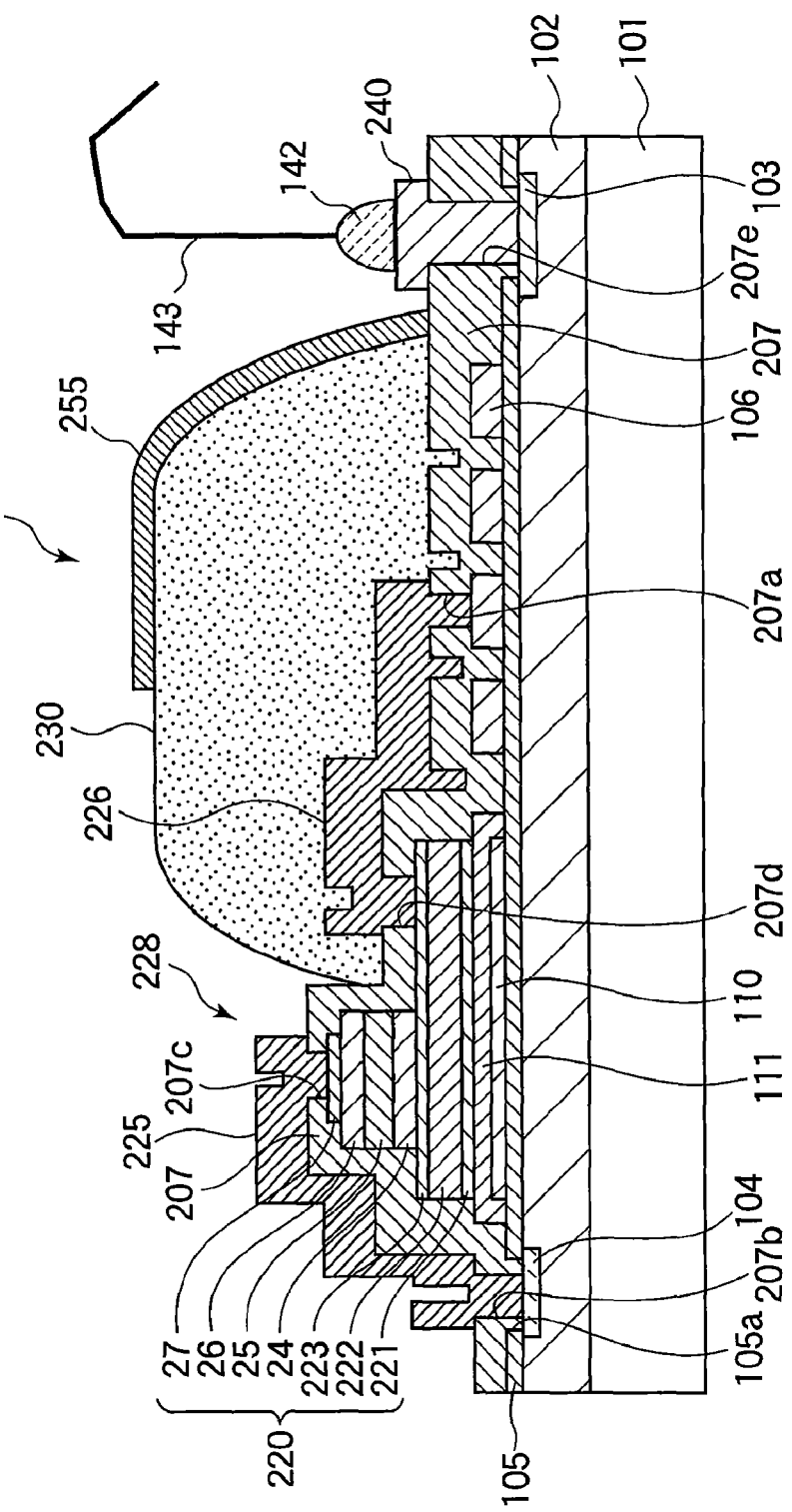
FIG. 12 is a cross-sectional view taken along a line E-E of FIG. 11.

FIG. 11 is a top view of a composite semiconductor device 250 of a third embodiment illustrating a pertinent portion. FIG. 12 is a cross-sectional view taken along a line E-E of FIG. 11. For simplicity's sake, interlayer dielectric films 105 and 207 are omitted from FIG. 11 and only openings formed in the interlayer dielectric films 105 and 207 are indicated by dotted lines.

The composite semiconductor device 250 differs from the composite semiconductor device 200 of the second embodiment in that an opaque film (e.g., metal) 255 is formed and the opaque film 235 is not formed. Elements equivalent to those of the first embodiment are given the same reference numerals and their description is omitted.

Referring to FIGS. 11 and 12, a light blocking layer 230 is formed to extend substantially over an entire area between the light emitting regions and a pad covering metal layer 240. An opaque film 255 covers substantially half the surface of the light blocking layer 230 closer to the connection pads 103.

The opaque film 255 blocks the light emitted from the light emitting elements and entered the light blocking layer 230, preventing the light from reaching any reflective objects such as connection wires 143. The opaque film 255 may be formed of a material containing Al or Au, i.e., Ti/Pt/Au, Cr/Au, Ni/Au, Ti, Ni, Ni/Al, or Al. The opaque film 255 may have any thickness provided that the light emitted from the light emitting elements is prevented from passing through. For example the thickness may be equal to or greater than 10 nm.

As described above, because the opaque film 255 covers substantially half the surface of the light blocking layer 230 closer to the light emitting elements, the light blocking layer may be formed very close to the light emitting elements. Unlike the second embodiment in which a metal layer is formed in a plane beside the light emitting regions, reflection effect may be obtained without sacrificing light utilization efficiency.

Fourth Embodiment

Figure 13:
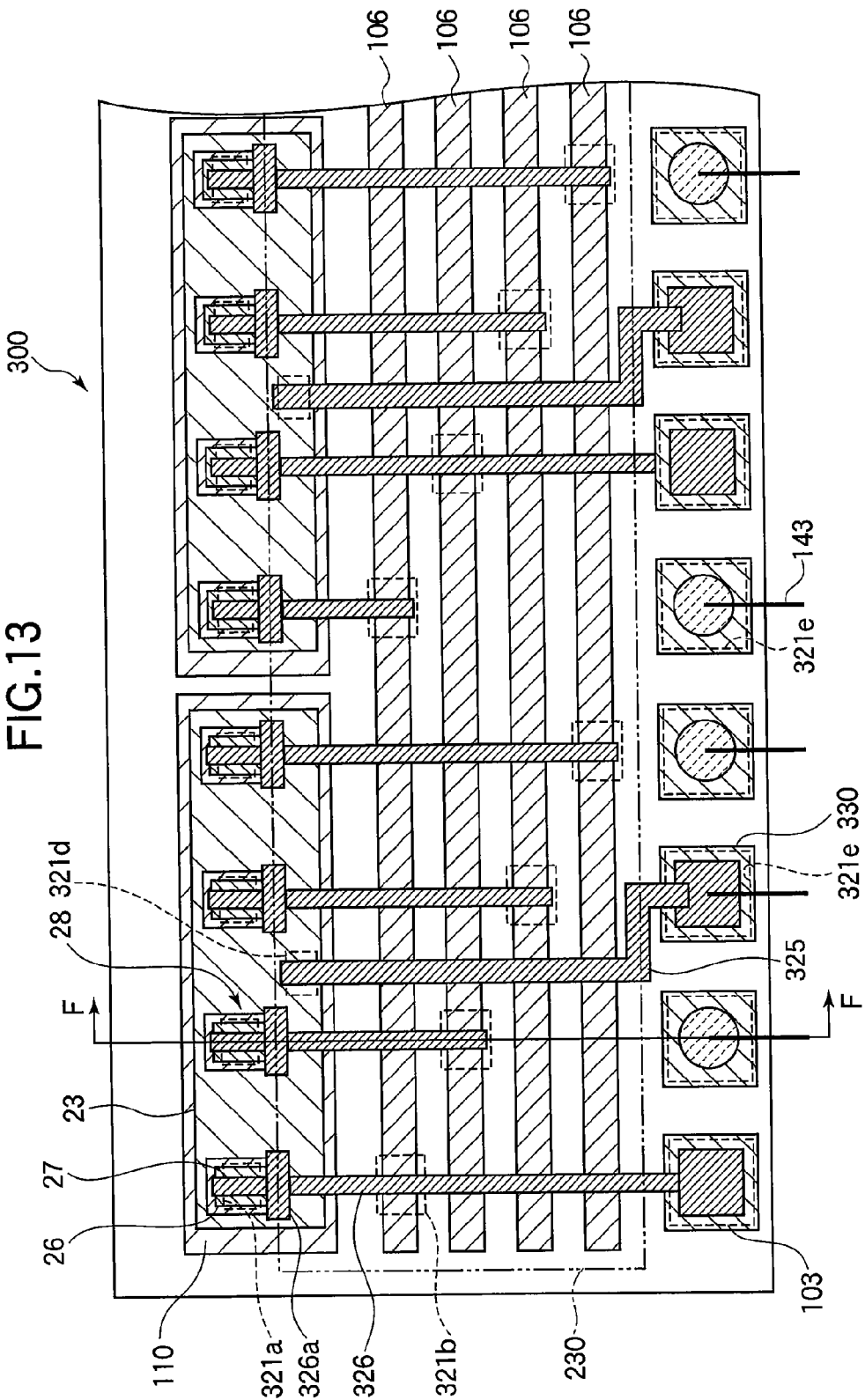
FIG. 13 is a top view of a composite semiconductor device of a fourth embodiment.
Figure 14:
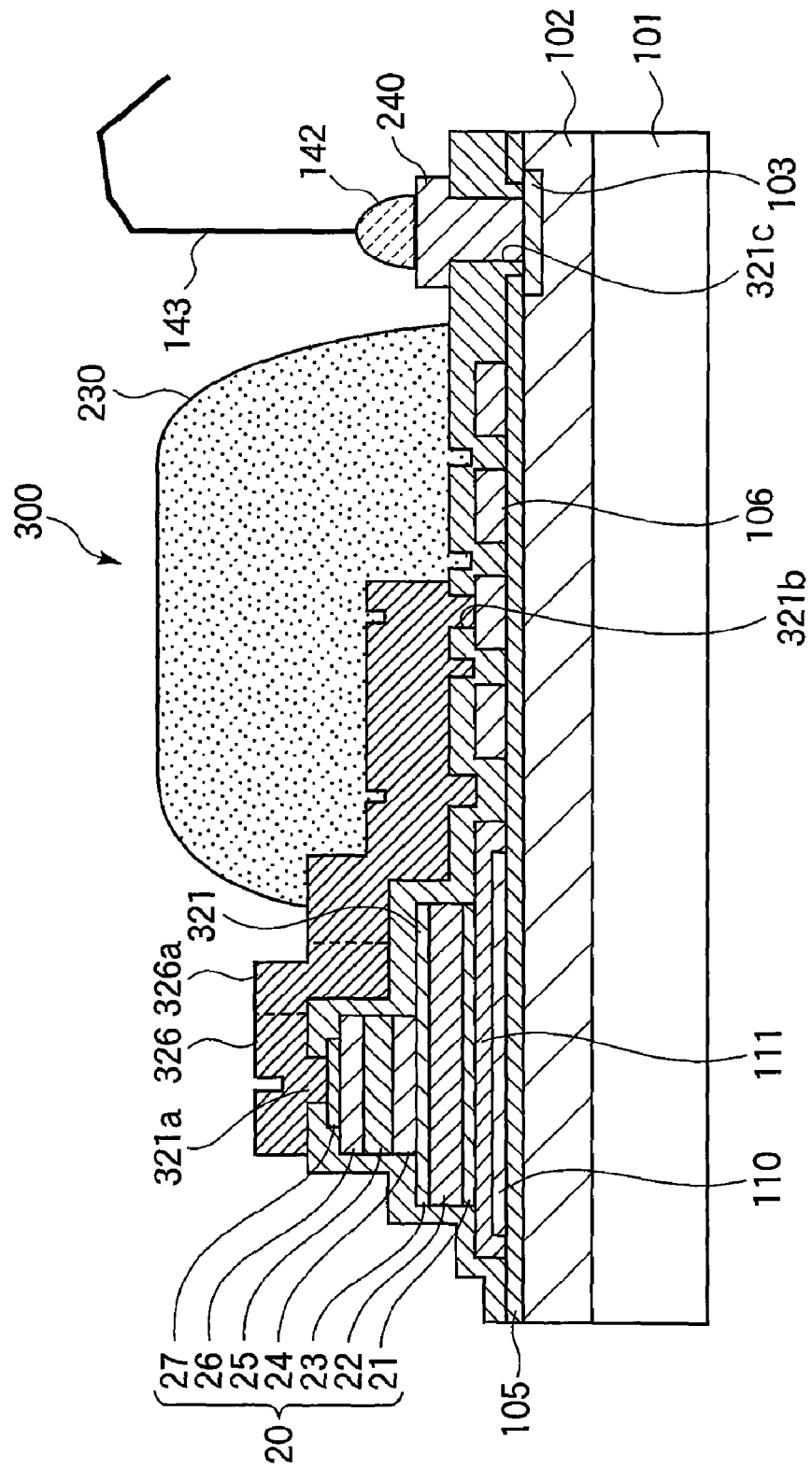
FIG. 14 is a cross-sectional view taken along a line F-F of FIG. 13.

FIG. 13 is a top view of a composite semiconductor device 300 of a fourth embodiment. FIG. 14 is a cross-sectional view taken along a line F-F of FIG. 13. For simplicity's sake, interlayer dielectric films 105 and 207 are omitted from FIG. 13 and only openings formed in the interlayer dielectric films 105 and 207 are indicated by dotted lines.

The composite semiconductor device 300 differs from the composite semiconductor device 100 of the first embodiment in that a light blocking section 326a in one piece with a p-type side contact metal 326 is formed between a light blocking layer 230 and light emitting regions and that an n-type contact layer 23 is connected to an n-side connection pad 330 through a wire/connection metal 325. Elements equivalent to those of the first embodiment are given the same reference numerals and their description is omitted.

Referring to FIG. 13, the wire/connection metal 325 extends through openings 321d and 321e formed in an interlayer dielectric film layer 321 to connect an n-type contact layer 23 of a light emitting portion 28 to the n-side connecting pad 330. The p-type side contact metal 326 extends through openings 321a and 321b to connect a p-type contact layer 27 of the light emitting portion 28 to a corresponding common wire 106. A p-type side electrode functions as a common electrode for each block of light emitting elements, and n-type side electrode of the respective light emitting element functions as an individual electrode of a corresponding light emitting element.

Referring to FIG. 14, a pad covering metal layer 240 is formed in an opening 321c formed in an interlayer dielectric film 321. A wire bump 142 is formed on the pad covering metal layer 240. The wire bump 142 connects the connection wire 143 to the connection pad 103 through the pad covering metal layer 240.

A light blocking layer 230 is formed to cover an entire area between the light emitting elements of a semiconductor thin film 20 and the pad covering metal layers 240.

The light blocking section 326a is formed to extend such that a vertical plane in which the light emitting element lies under the light blocking section 326a. The p-type side contact metal 326 in one piece with the light blocking section 326a may be formed of, for example, Ti/Pt/Au. The metal material for the p-type side contact metal 326 may be selected appropriately depending on the light emitting semiconductor material used.

The p-type side contact metal 326 extends over the vertical plane in which the light emitting region lies under the light blocking section 326a. Therefore, forming the light blocking section 326a will not affect significantly to the light utilization efficiency. The light blocking section 326a is formed as a part of wire in one piece with the p-type side contact metal 326. There is no possibility of light blocking metal being short-circuited to the wires.

The light emitting portions in the second to fourth embodiments may be formed by doping instead of isolating by mesa etching just as in the first embodiment.

As described above, the light blocking section 326a prevents the light from transmitting through the light blocking layer 230. The light blocking section 326a in one piece with the p-type side contact metal 326 will not deteriorate the light utilization efficiency. While the light blocking section 326a is formed in a small area, there is no possibility of the light blocking section 326a of causing a short circuit.

Fifth Embodiment

Figure 15:
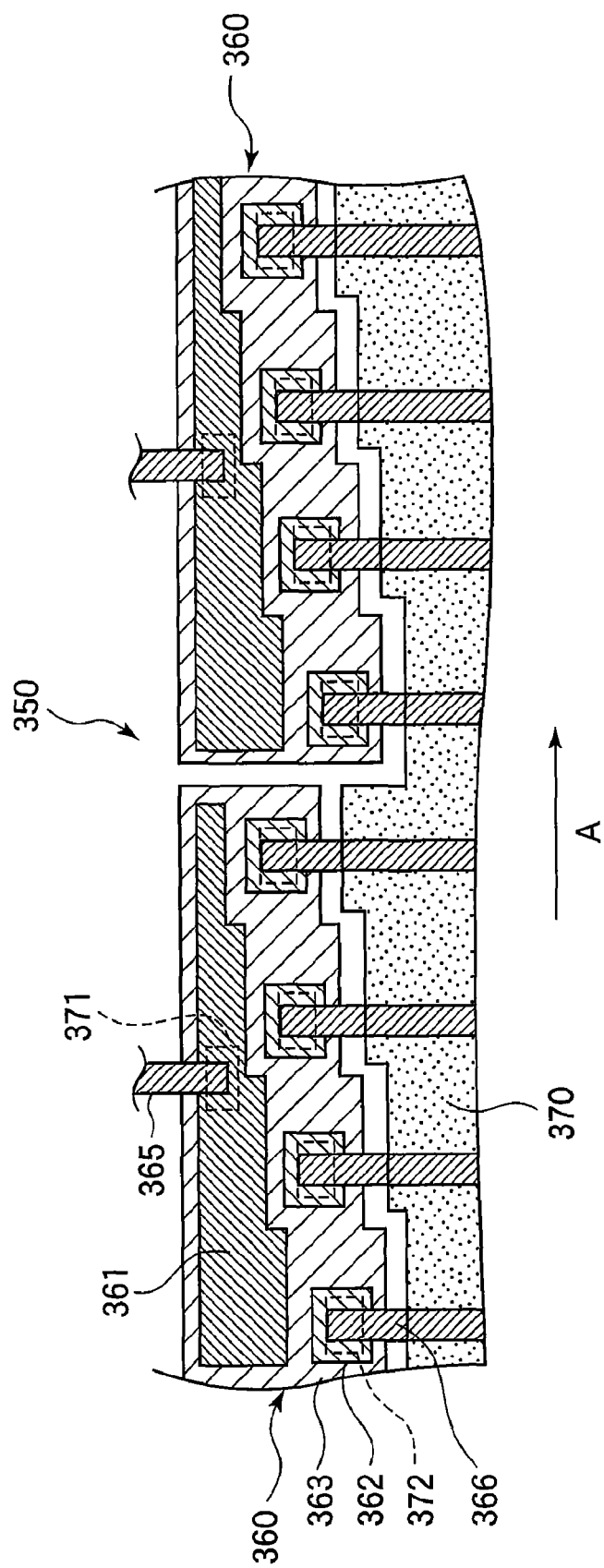
FIG. 15 is a top view of a composite semiconductor device of a fifth embodiment.

FIG. 15 is a top view of a composite semiconductor device 350 of a fifth embodiment illustrating a pertinent portion.

The composite semiconductor device 350 differs from the composite semiconductor device 100 of the first embodiment in the arrangement of light emitting elements formed in a semiconductor thin film and their connection. Elements equivalent to those of the first embodiment are given the same reference numerals and their description is omitted. Thus, the description is focused on portions different from the first embodiment.

Referring to FIG. 15, reference numeral 370 denoted a light blocking layer. An area 363 of first conductive type of each semiconductor thin film 360 includes a plurality of light emitting elements 362 and a contact 361 of first conductive type. Each of the light emitting elements 362 includes light emitting device structure. The contact 361 of first conductive type side is connected to a wire 365 of first conductive type side through an opening 371 formed in an interlayer dielectric film (not shown). The light emitting elements 362 are connected to corresponding electrodes 366 of second conductive type side through openings 372 formed in the interlayer dielectric film (not shown). A light emitting element in the fifth embodiment may take the form of an LED.

The wire 365 of first conductive type side is connected to, for example, the connection region pad 104 in FIG. 2 while the electrodes 366 of second conductive type side are connected to common electrodes 106 just as in the p-type side contact metal in FIG. 1. Thus, the electrodes 366 of second conductive type side serve as an individual electrode while the wire 365 of first conductive type side serves as a common electrode. The light blocking layer 370 is formed to cover an entire area between the light emitting elements and the connection pads.

The light emitting elements 362 are aligned generally in a direction shown by arrow A such that each light emitting element is displaced by a predetermined distance ahead of a preceding one in a direction transverse to the direction of the arrow A. Likewise, regions 363 of first conductive type are also aligned generally in a direction shown by arrow A such that each region 363 is displaced by a predetermined distance ahead of a preceding one in a direction transverse to the direction of the arrow A, and the light blocking layer 370 is also shaped such that an edge portion of the light blocking layer 370 close to the region 363 is displaced by a predetermined distance ahead of a preceding one in a direction transverse to the direction of the arrow A. The contact 361 of first conductive side is also shaped such that an edge portion of the contact 361 close to the region 363 is displaced by a predetermined distance ahead of a preceding one in a direction transverse to the direction of the arrow A.

As described above, when the light emitting elements 362 are aligned generally in a direction shown by arrow A such that each light emitting elements 362 is displaced by a predetermined distance ahead of a preceding one, the light blocking layer 370 may be formed close to the light emitting portions 362. Additionally, the contact 361 of first conductive side may also be shaped in correspondence with the arrangement of the light emitting elements 362 such that the distance between the contact 361 of first conductive type side and light emitting elements 362 is equivalent for each light emitting device portion. Thus, variations of the light emitting characteristics and electrical characteristics of the respective light emitting elements may be small.

The light emitting elements 362 may be formed as follows: An impurity of second conductive type (e.g., p-type) is selectively diffused into the region 363 of first conductive type of the semiconductor thin film 360 of first conductive type (e.g., n-type) to form a diffusion region, thereby forming a diffusion front that defines a pn junction in an active layer of the diffusion region.

Figure 16:
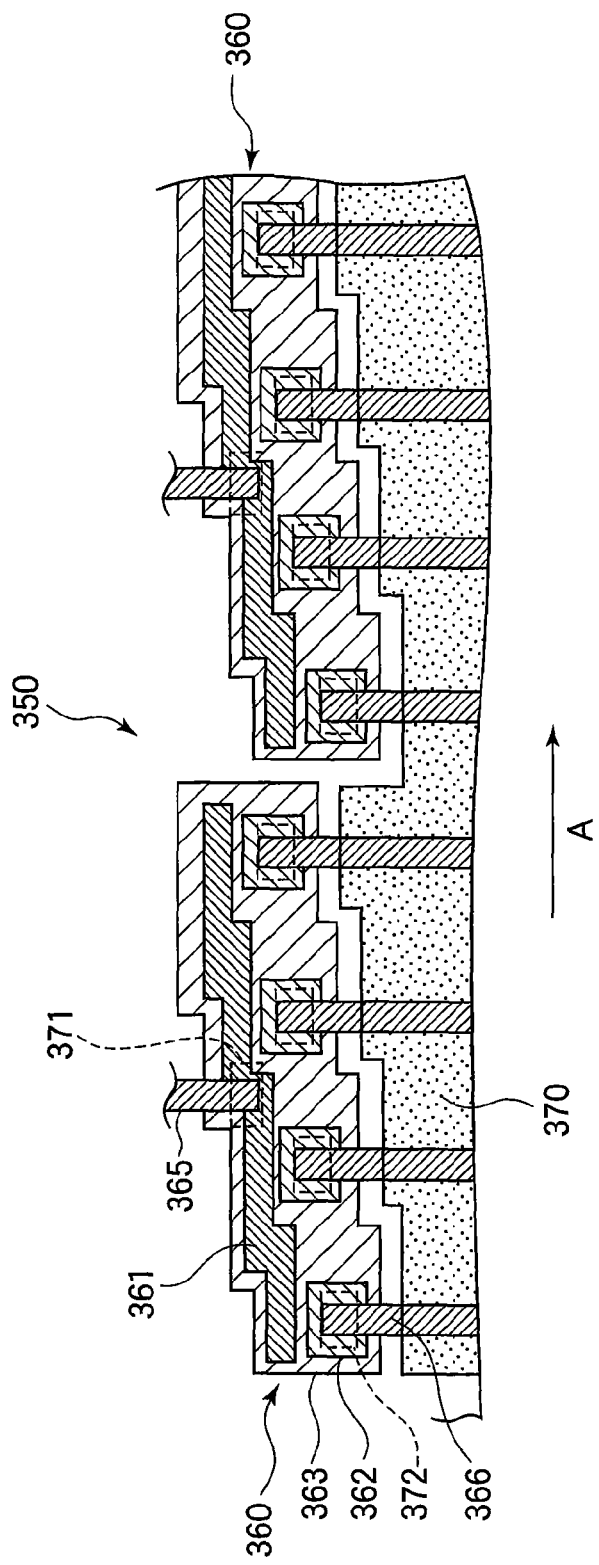
FIG. 16 is a top view of a first modification to the fifth embodiment.

FIG. 16 is a top view of a first modification to the composite semiconductor device 350 illustrating a pertinent portion. As shown in FIG. 16, the contact 361 of first conductive side may also be shaped such that an edge portion of the contact 361 opposite the region 363 is displaced ahead of a preceding one in a direction transverse to the direction of the arrow A.

Figure 17:
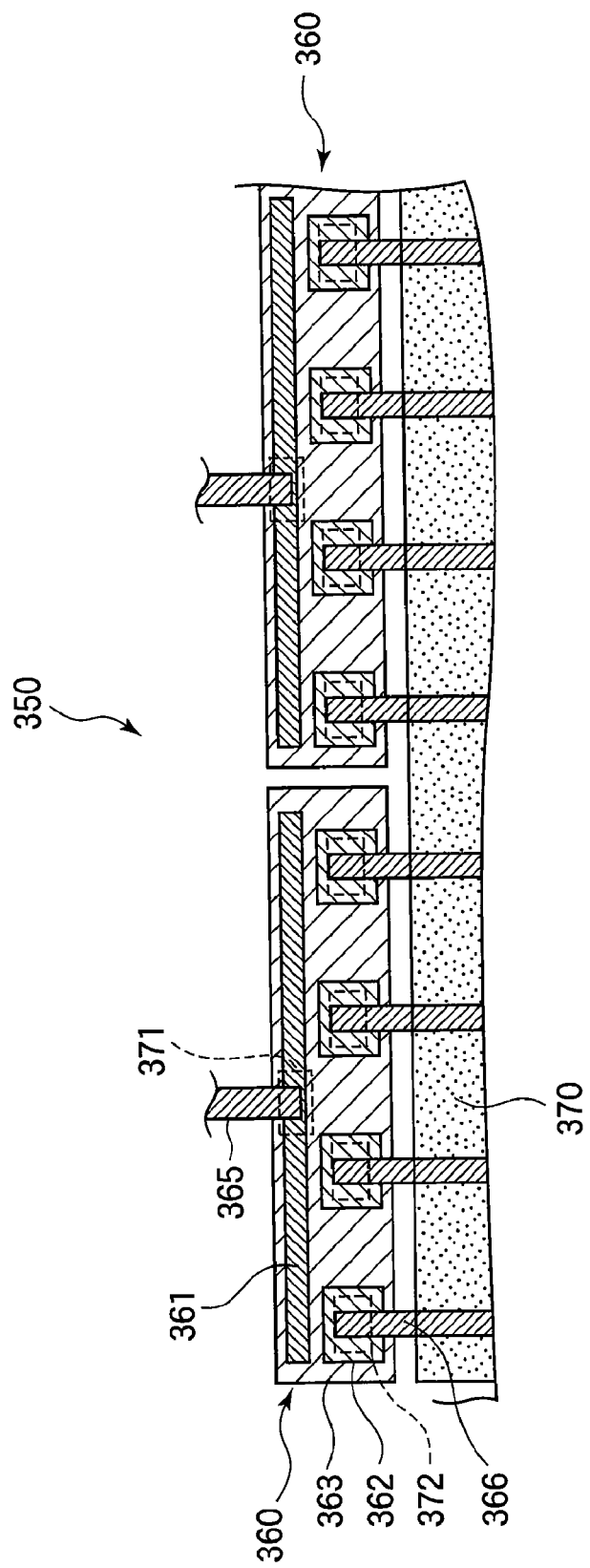
FIG. 17 is a top view of a second modification to the fifth embodiment.

FIG. 17 is a top view of a second modification to the composite semiconductor device 350 illustrating a pertinent portion. The respective light emitting elements 362 are aligned straight in a longitudinal direction of the semiconductor thin film 360. The contact 361 of first conductive side and the semiconductor thin film 360 of first conductive type (e.g., n-type) also extend straight in directions parallel to the direction in which the respective light emitting elements 362 are aligned.

Figure 18:
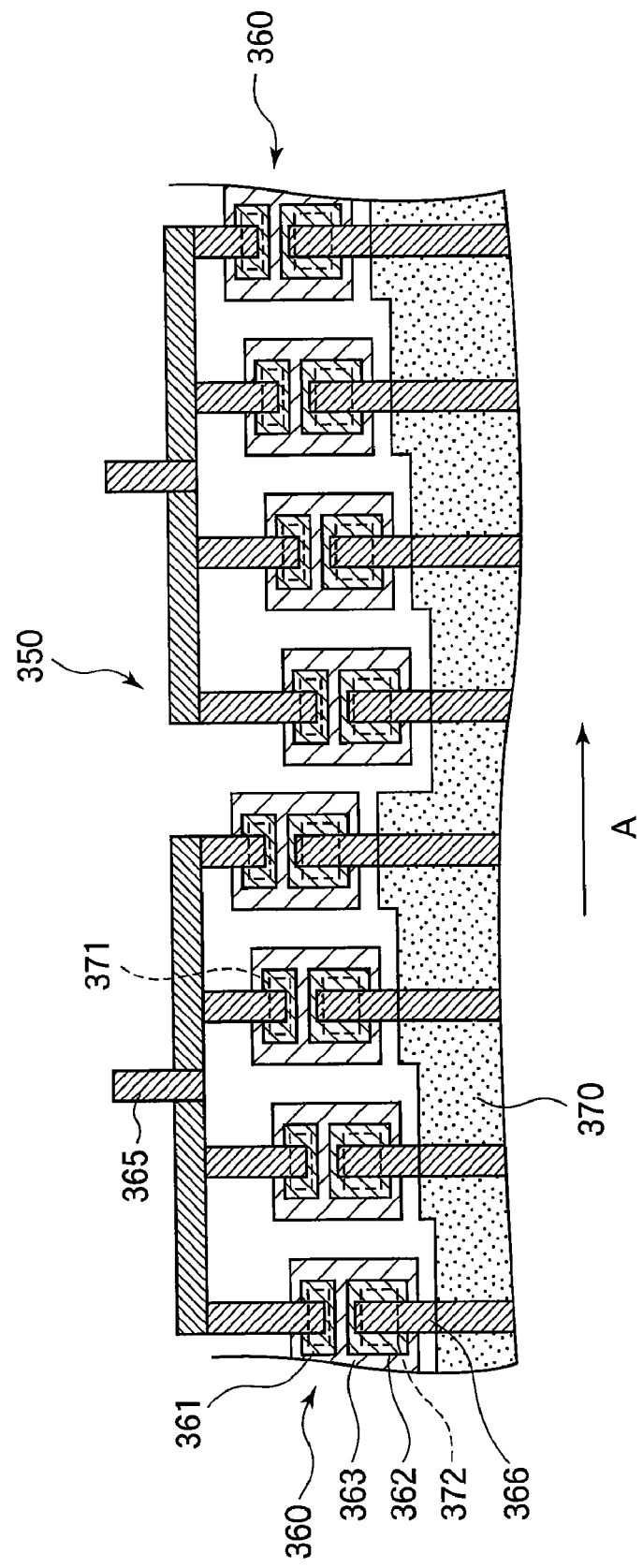
FIG. 18 is a top view of a third modification to the fifth embodiment.

FIG. 18 is a top view of a third modification to the composite semiconductor device 350 illustrating a pertinent portion. Each light emitting element 362 is formed on each of isolated semiconductor thin films 360 that are aligned generally in a direction such that each light emitting element is displaced ahead of a preceding one in a direction transverse to the direction of the arrow A. While the third modification has been described in terms of a configuration in which each semiconductor thin film includes one corresponding light emitting element 362, the number of light emitting elements is not limited to one. For example, a semiconductor thin film may include two light emitting elements.

As described above, when the light emitting elements are aligned in a direction such that each light emitting element is displaced ahead of a preceding one, the light blocking layer may be formed in the vicinity of the light emitting elements without overlapping the light emitting elements. Further, because the contact 361 of first conductive type side is shaped in correspondence with the arrangement of the light emitting elements such that an edge portion of the contact 361 close to the light emitting portion is displaced ahead of a preceding one, the respective light emitting elements may have uniform light emitting characteristics and electrical characteristics.

Figure 19:
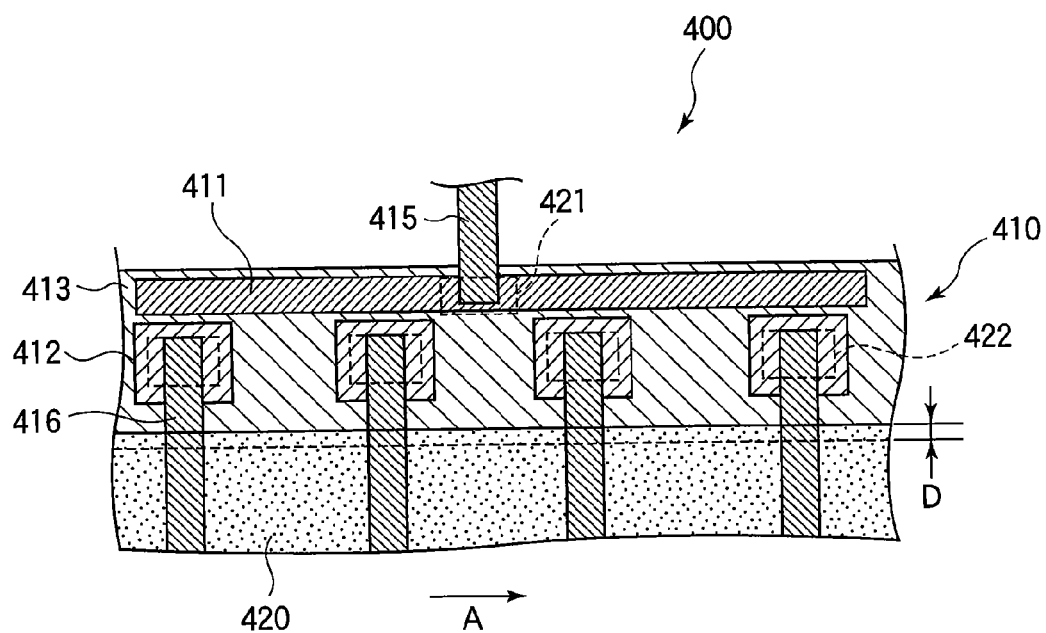
FIG. 19 is a top view of a composite semiconductor device 400 of a sixth embodiment.

FIG. 19 is a top view of a composite semiconductor device 400 of a sixth embodiment illustrating a pertinent portion.

The composite semiconductor device 400 differs from the composite semiconductor device 100 of the first embodiment in the arrangement of light emitting portions formed in a semiconductor thin film and their connection. Elements equivalent to those of the first embodiment are given the same reference numerals and their description is omitted. Thus, the description is focused on portions different from the first embodiment.

Referring to FIG. 19, a semiconductor thin film 410 of the composite semiconductor device 400 includes a region 413 of first conductive type in which a plurality of light emitting elements 412 and a contact 411 of first conductive type are formed. The contact 411 of first conductive type is electrically connected to a wire 415 of first conductive type side through an opening 421 formed in an interlayer dielectric film (not shown). An electrodes 416 of second conductive side are electrically connected to corresponding light emitting elements 412 through contact layers of second conductive side (not shown) and openings 422 formed in an interlayer dielectric film (not shown).

The light emitting elements 412 are formed by a conventional technique as follows: An impurity of second conductive type is diffused into the region 413 of first conductive type of the semiconductor thin film 410 of first conductivity type (e.g., n-type), thereby forming a light emitting element in each diffusion region where a diffusion front forms a pn junction in an active layer.

The contact 415 of first conductive side is connected to, for example, the connection region pad 104 (e.g., FIG. 2) while the electrodes 416 of second conductive side are connected to the common wires 106 just as the p-type side contact metal (e.g., FIG. 1). The electrode of second conductive side functions as an individual electrode for each light emitting portion 412 and the contact of first conductive side functions as a common electrode for each block of light emitting elements 412.

The light emitting elements 412 are aligned straight in a direction shown by arrow A. In order to dispose a light blocking layer 420 very close to the light emitting elements 412, the light blocking layer 420 overlaps the semiconductor thin film 410 by a distance D. Too long a distance D significantly affects the semiconductor thin film reliability. The distance D is selected to be equal to or less than 5 μm and more preferably equal to or less than 1 μm.

The light emitting elements may be aligned generally in a direction shown by arrow A such that each light emitting element is displaced ahead of a preceding one in a direction transverse to the direction of the arrow A just as in the fifth embodiment.

Disposing the semiconductor thin film and light blocking layer such that they overlap each other by a distance equal to or less than 5 μm prevents the light blocking layer from adversely affecting the semiconductor thin film reliability while also allowing the light blocking layer to be as close to the light emitting portions as possible.

Seventh Embodiment

Figure 20:
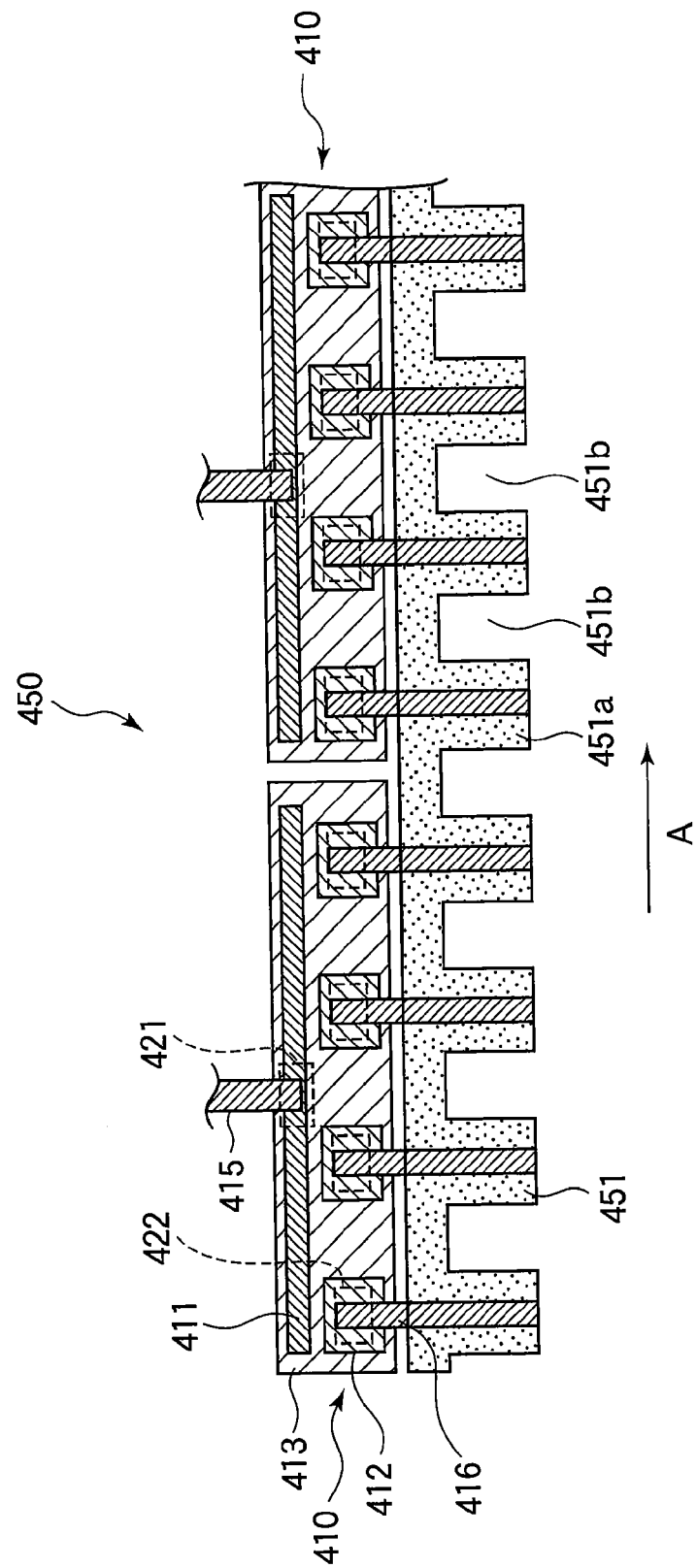
FIG. 20 is a top view of a composite semiconductor device 450 of a seventh embodiment.

FIG. 20 is a top view of a composite semiconductor device 450 of a seventh embodiment illustrating a pertinent portion.

The composite semiconductor device 450 differs from the composite semiconductor device 400 of the sixth embodiment in the shape and arrangement of a light blocking layer. Elements equivalent to those of the sixth embodiment are given the same reference numerals and their description is omitted. The description will be focused on portions different from the sixth embodiment.

A light blocking layer 451 generally extends along a row of light emitting elements 412, and is in the shape of a comb having fingers 451a extending away from the light emitting elements over the electrodes 416 of second conductive side. Adjacent fingers 451a define a slit 451b between them.

While the seventh embodiment has been described with respect to light emitting elements aligned straight, the light emitting elements may be arranged such that each light emitting element is displaced ahead of a preceding one.

By cutting out portions of a light blocking layer such that the light blocking layer is in the shape of a comb, the stress exerted on the chips by the light blocking layer may be reduced.

Eighth Embodiment

Figure 21:
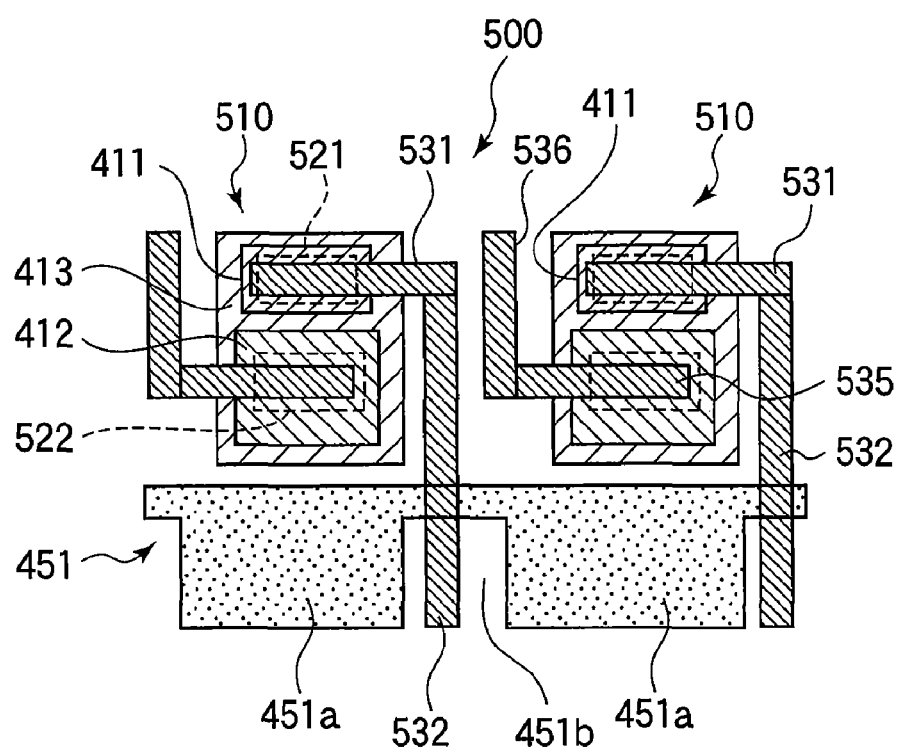
FIG. 21 is a top view of a composite semiconductor device 500 of an eighth embodiment.

FIG. 21 is a top view of a composite semiconductor device 500 of an eighth embodiment illustrating a pertinent portion.

The composite semiconductor device 500 differs from the composite semiconductor device 450 of the seventh embodiment in that a plurality of semiconductor thin films are isolated such that each semiconductor thin film includes a corresponding light emitting portion, and in that wires connected to the light emitting elements 412 are routed in a different configuration. Elements equivalent to those of the composite semiconductor device 450 are given the same reference numerals and their description is omitted.

Referring to FIG. 21, each semiconductor thin film 510 is spaced apart from its adjacent one, and includes a corresponding light emitting element 412 for which a contact 411 for a first conductive side is formed. The light emitting portion 412 includes a contact 411 for a second conductive side, and an electrode 531 for the first conductive side is electrically connected to the contact 411 through an opening 521 formed in an interlayer dielectric film (not shown). The light emitting portion 412 also includes a contact for second conductive side, and an electrode 535 for the second conductive side is electrically connected to the contact through an opening 522 formed in the interlayer dielectric film (not shown). The electrodes 531 and 535 extend in directions parallel to a direction in which the light emitting elements 412 are aligned. The electrode 531 is connected to a wire 532 for the first conductive side and the electrode 535 is connected to a wire 536 for the second conductive side. A comb-shaped light blocking layer 451 extends generally in the direction in which the light emitting portions are aligned, and includes fingers 451a and slits 451b between the fingers.

The wires 532 extend under the comb-shaped light blocking layer 451 through the slits 451b and away from the light emitting elements in directions substantially perpendicular to the direction in which the light emitting elements are aligned. The wires 536 extend in directions opposite to the direction in which the wires 532 extend.

Figure 22:
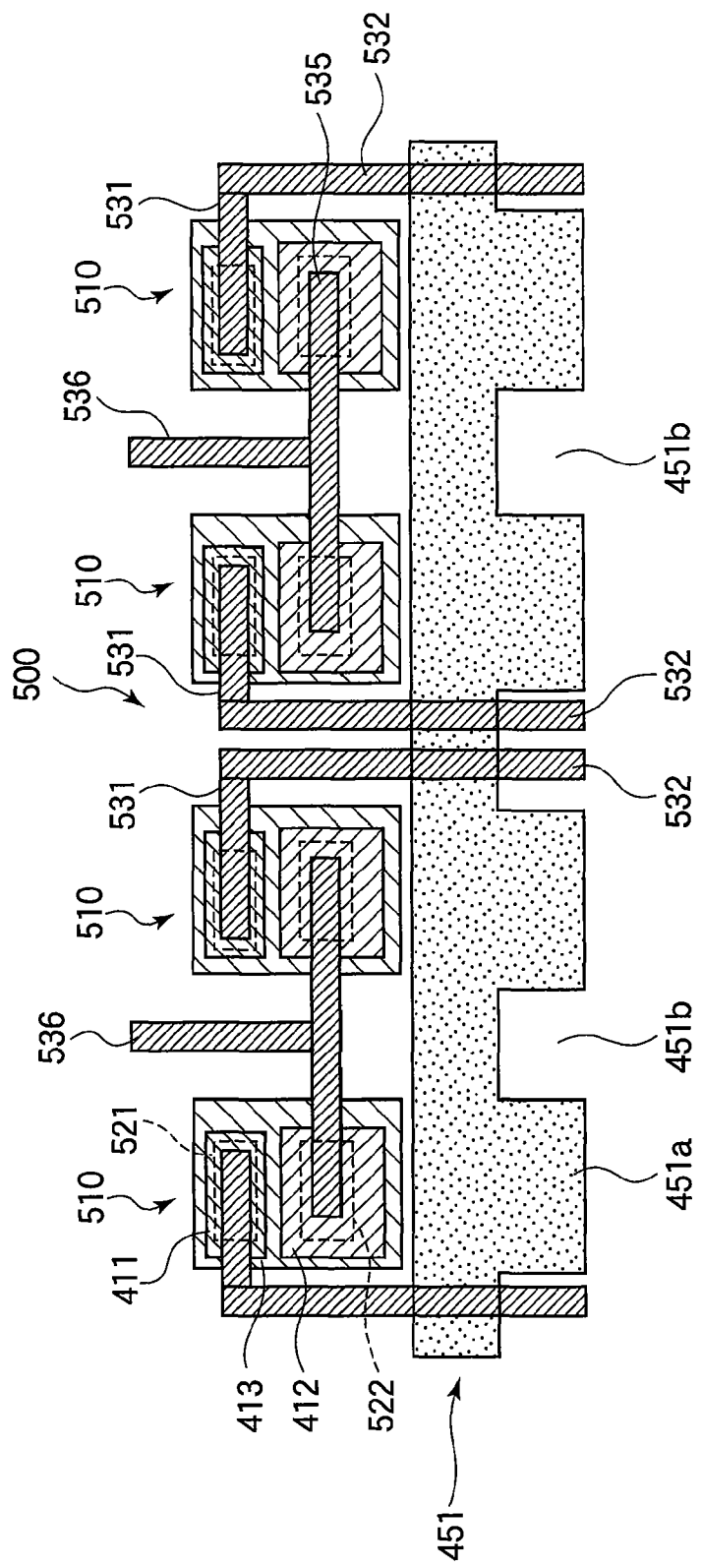
FIG. 22 is a top view of a first modification to the eighth embodiment.

FIG. 22 is a top view of a first modification to the composite semiconductor device 500 illustrating a pertinent portion. Referring to FIG. 22, a plurality of groups of two semiconductor thin films 510 are aligned in a longitudinal direction of the composite semiconductor device 500 such that a row of electrodes 510 and a row of electrodes 535 of the semiconductor thin films 510 extend in directions parallel to the longitudinal direction. The electrode 535 is common to the semiconductor thin films in each group. Two adjacent wires 532 are connected to the electrodes 531 and extend side by side under the light blocking layer 451. Wires 536 are connected to the electrodes 535 and extend in the opposite directions to the wires 532.

Figure 23:
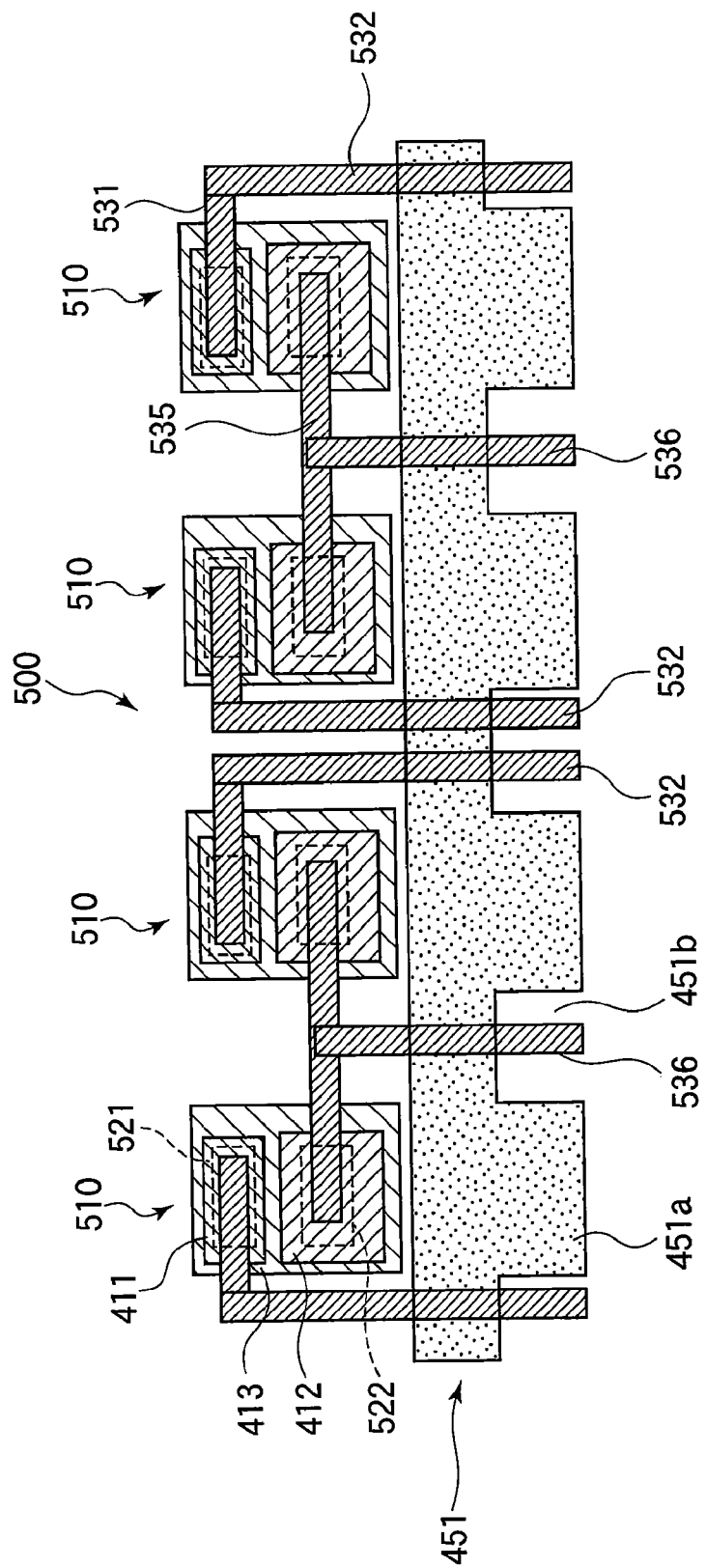
FIG. 23 is a top view of a second modification to the eighth embodiment.

FIG. 23 is a top view of a second modification to the composite semiconductor device 500 illustrating a pertinent portion. The comb-shaped light blocking layer 451 extends generally in the direction in which the light emitting elements are aligned, and includes the fingers 451a and the slits 451b between the fingers 451a. Referring to FIG. 23, a plurality of groups of two semiconductor thin films 510 are aligned in a longitudinal direction of the composite semiconductor device 500 such that a row of electrodes 510 and a row of electrodes 535 of the semiconductor thin films 510 extend in directions parallel to the longitudinal direction. The electrode 535 is common to the semiconductor thin films in each group. Two adjacent wires 532 are connected to the electrodes 531 and extend side by side. Two adjacent wires 532 are connected to the electrodes 531 and extend side by side under the light blocking layer 451 through the slits 451b. Wires 536 are connected to the electrodes 535 and extend under the light blocking layer 451 through the slits 451b in directions parallel to the wires 532.

Figure 24:
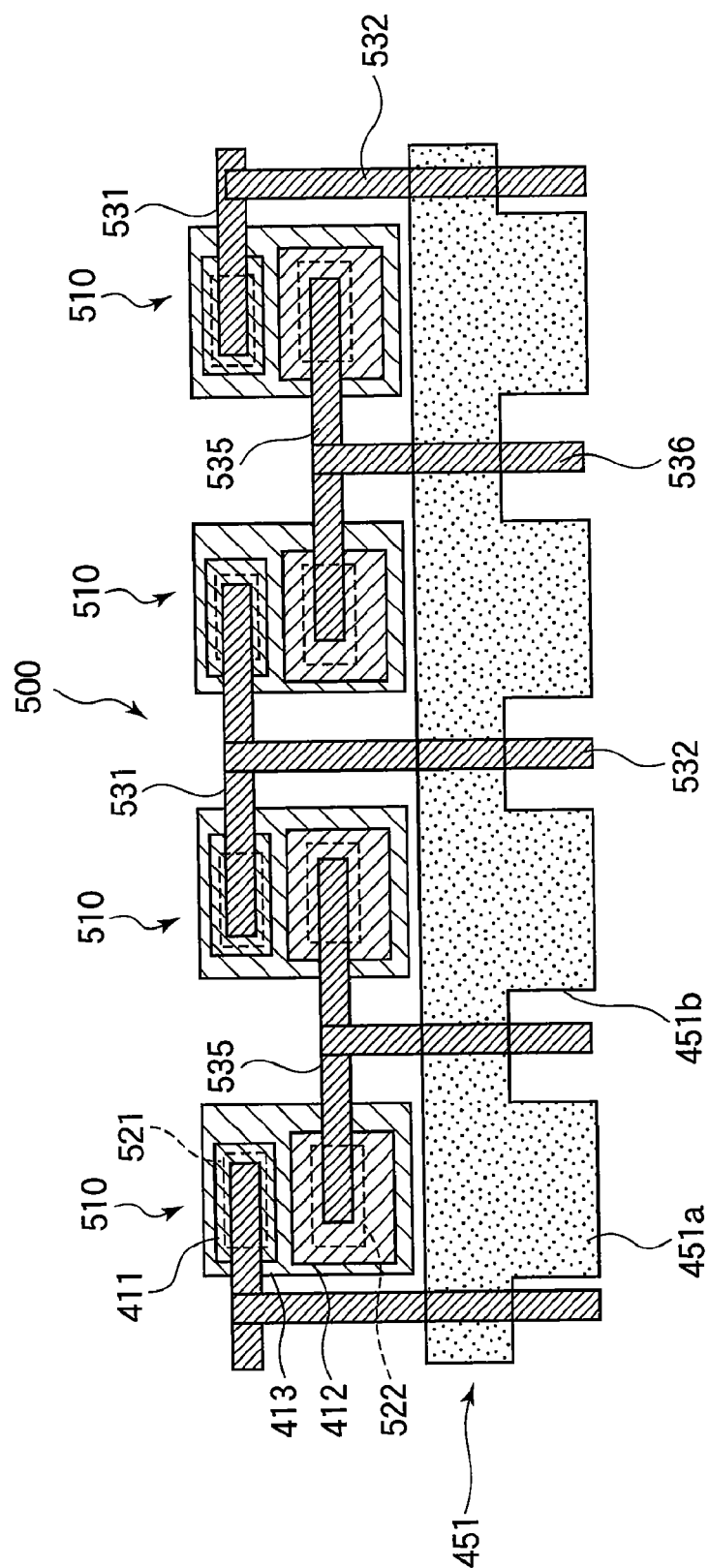
FIG. 24 is a top view of a third modification to the eighth embodiment.

FIG. 24 is a top view of a third modification to the composite device 500 of the eighth embodiment. Referring to FIG. 24, a plurality of groups of two semiconductor thin films 510 are aligned in a longitudinal direction of the composite semiconductor device 500. The two adjacent semiconductor thin films 510 in each group are connected to a common electrode 531 or a common electrode 535. One of the semiconductor thin films 510 in one of the two adjacent groups and one of the semiconductor thin films 510 in the other of the two adjacent groups are connected to the common electrode 535 or the common electrode 531. A light blocking layer 451 is in the shape of a comb having fingers 451a that define a slit 451b between them. The light blocking layer 451 generally extends along a row of light emitting elements 412. The light blocking layer 451 also extends away from the light emitting elements 412 over the wires 532 so that the wires 532 extend under the comb-shaped light blocking layer 451 through the slits 451b. The wires 536 extend in directions opposite to the direction in which the wires 532 extend.

Figure 25:
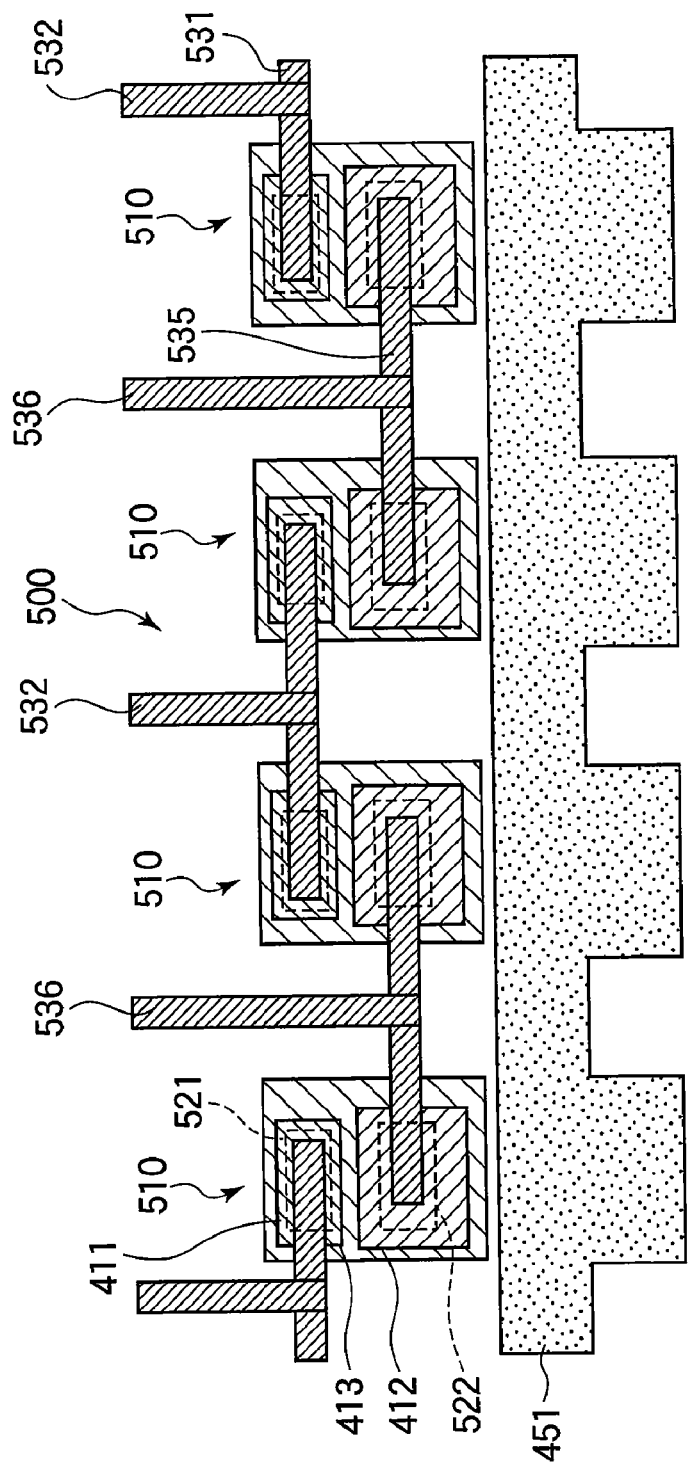
FIG. 25 illustrates a fourth modification to the eighth embodiment.

FIG. 25 illustrates a fourth modification to the composite device 500 of the eighth embodiment. Referring to FIG. 25, a plurality of groups of two semiconductor thin films 510 are aligned in a longitudinal direction of the composite semiconductor device 500. The two adjacent semiconductor thin films 510 in each group are connected to a common electrode 531 or a common electrode 535. One of the semiconductor thin films 510 in one of the two adjacent groups and one of the semiconductor thin films 510 in the other of the two adjacent groups are connected to the common electrode 535 or the common electrode 531. A light blocking layer 451 is in the shape of a comb having fingers 451a that define a slit 451b between them. The light blocking layer 451 generally extends along a row of light emitting elements 412. The light blocking layer 451 also extends away from the light emitting elements 412 includes fingers and slits defined between adjacent fingers. The wires 536 and 532 extend in directions away from the light blocking layer 451.

Figure 26:
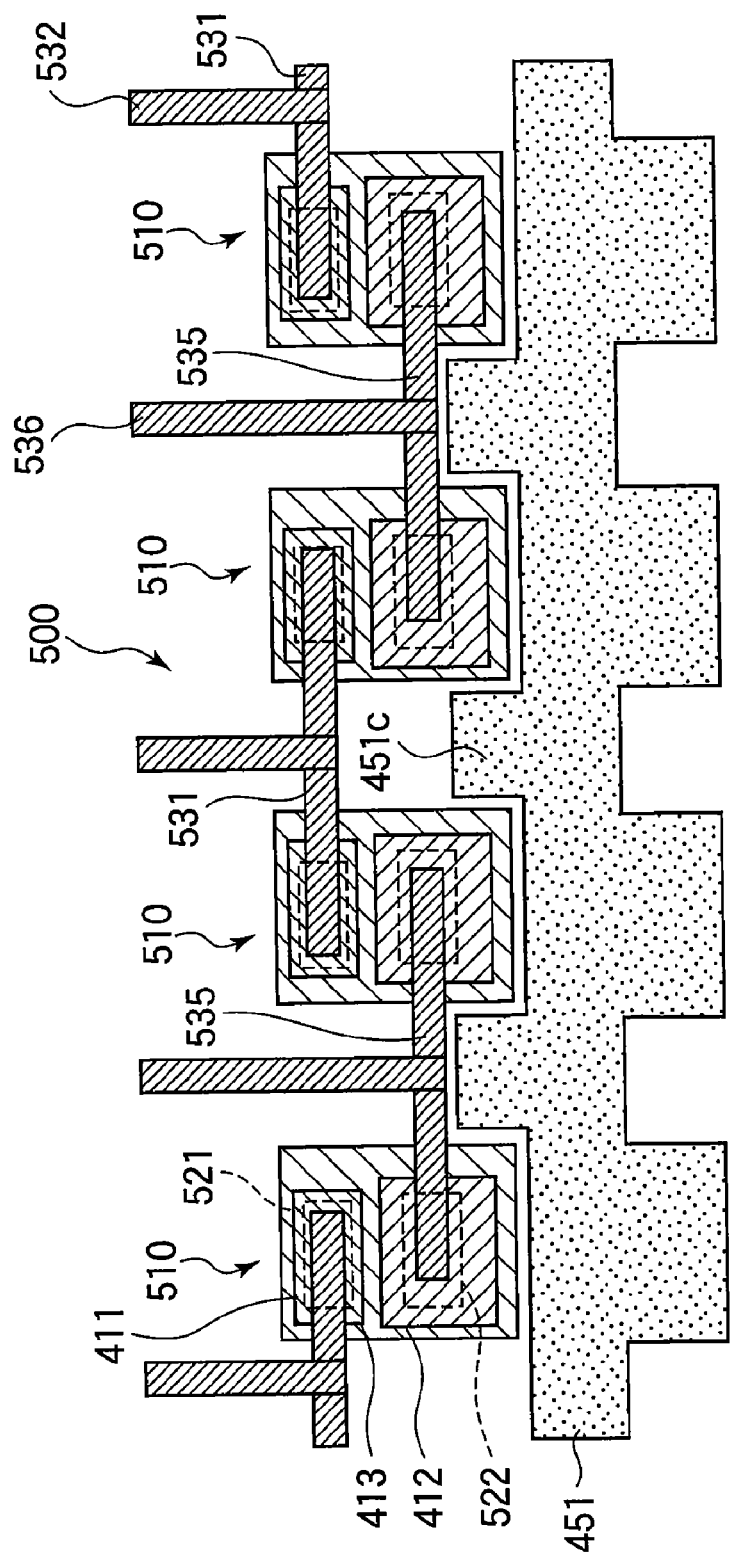
FIG. 26 illustrates a fifth modification to the eighth embodiment.

FIG. 26 illustrates a fifth modification to the composite device 500 of the eighth embodiment. Referring to FIG. 26, the fifth modification differs from the fourth modification in that the light blocking layer 451 include extension regions 451c that extend in areas between adjacent semiconductor thin films 510. The modifications in FIGS. 22-26 may be applied to arrangements of light emitting elements and drive methods different from those described and illustrated above.

As described above, by cutting out portions (slits) of a light blocking layer such that the light blocking layer is in the shape of a comb, the stress exerted on the chips by the light blocking layer may be reduced.

Ninth Embodiment

Figure 27:
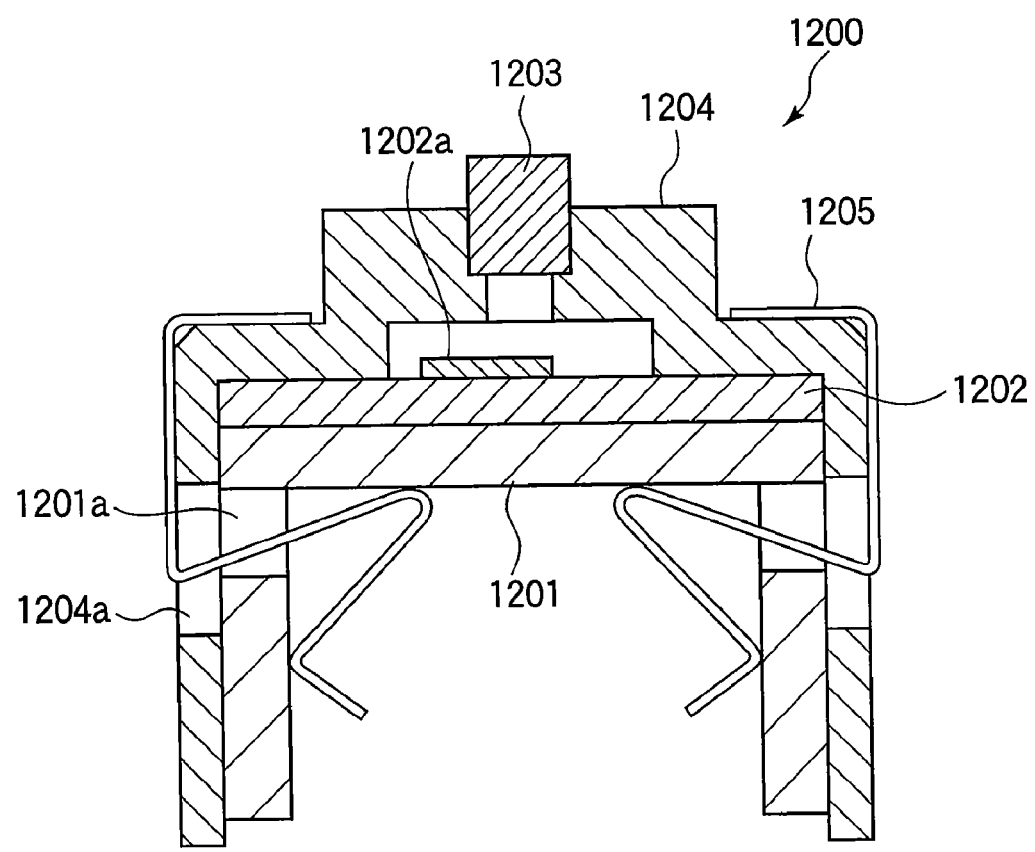
FIG. 27 illustrates an LED print head of a ninth embodiment.

FIG. 27 illustrates an LED print head 1200 of a ninth embodiment.

Figure 28:
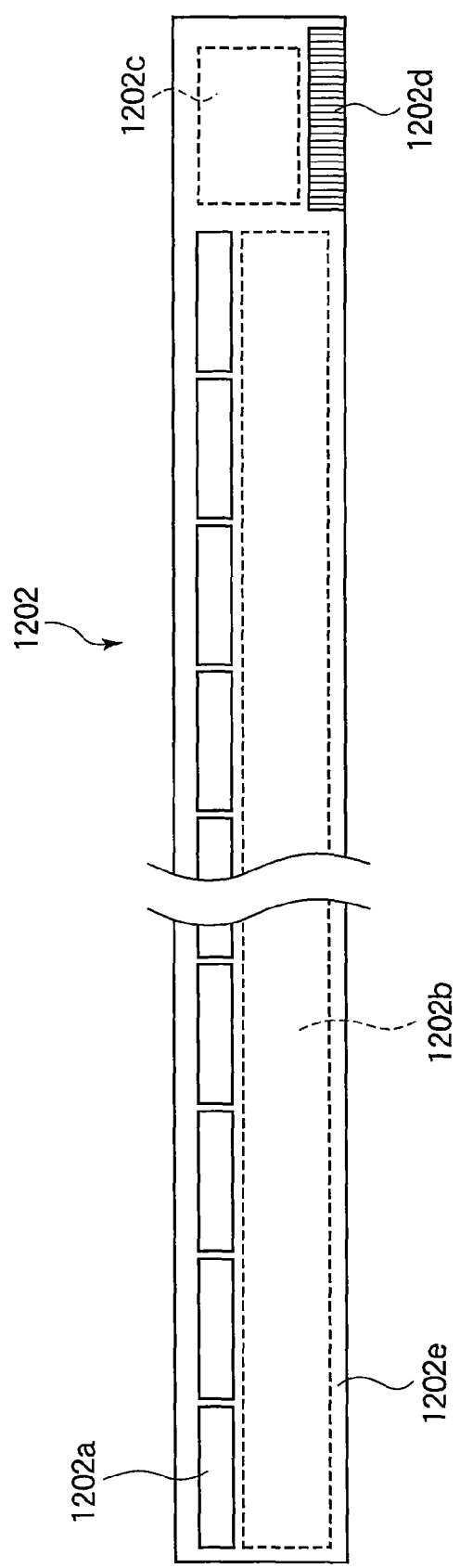
FIG. 28 is a top view illustrating a configuration of the LED unit of FIG. 27.

Referring to FIG. 27, the LED print head includes an LED unit 1202 mounted on a base 1201. One of the composite semiconductor devices of the first to eighth embodiments is mounted on a printed circuit board 1202e of the LED unit 1202. FIG. 28 is a top view illustrating a configuration of the LED unit 1202. The composite semiconductor device including light emitting elements and driver circuits aligned in a longitudinal direction of the LED unit 1202 and serve as a light emitting unit 1202a. The printed circuit board 1202e includes areas 1202b and 1202c in which electronic parts are mounted and wired and a connector 1202d for feeding controls signals and electric power to the light emitting elements and driver circuits.

Referring back to FIG. 27, a rod lens array 1203 is disposed over the light emitting unit 1202a and focuses the light emitted from the light emitting elements. The rod lens array 1203 includes a plurality of cylindrical optical lenses aligned along the row of the light emitting elements (e.g., row of the semiconductor layer 312 in FIG. 6) of the light emitting unit 1202a. A lens holder 1204 holds the rod lens array 1203 in position.

The lens holder 1204 is mounted to cover the base 1201 and the LED unit 1202. The base 1201, LED unit 1202, and lens holder 1204 are held together by dampers 1205 mounted through openings 1201a formed in the base 1201 and openings 1204a formed in the lens holder 1204. The light emitted from the LED unit 1202 transmits through the rod lens array 1203. The LED print head 1200 is used as an exposing unit for, for example, an electrophotographic printer or an electrophotographic copier.

As described, the use of one of the composite semiconductor devices of the first to eighth embodiments offers an LED print head of high quality and high reliability.

Tenth Embodiment

Figure 29:
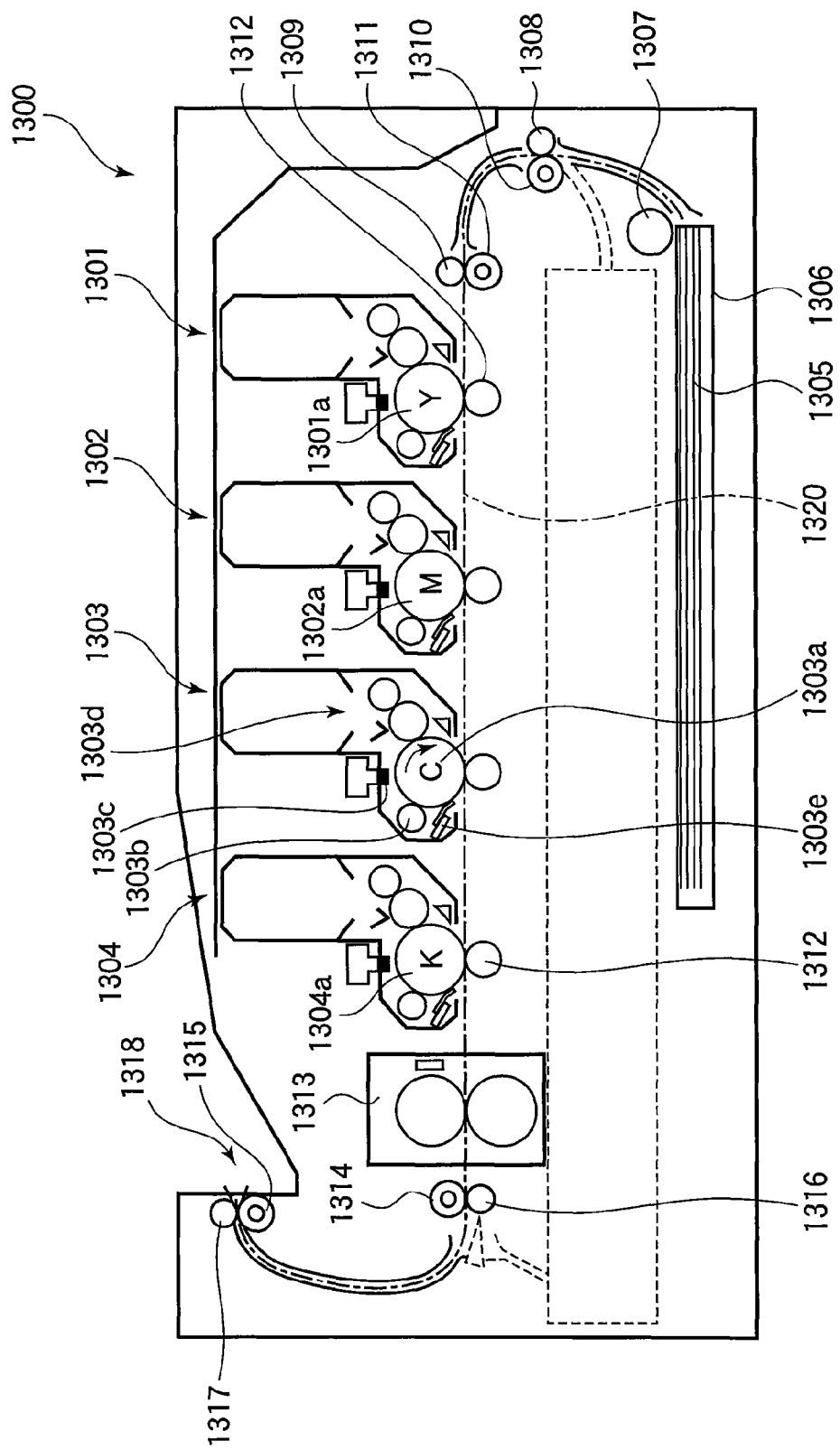
FIG. 29 illustrates a pertinent portion of an image forming apparatus of a tenth embodiment.

FIG. 29 illustrates a pertinent portion of an image forming apparatus 1300 of a tenth embodiment.

Referring to FIG. 29, the image forming apparatus 1300 four process units 1301-1304 are aligned along a transport path 1320 of a print medium 1305 from upstream to downstream of the transport path 1320, and form yellow, magenta, cyan, and black images, respectively. The configuration of the process units is substantially identical; for simplicity's sake only the operation of the process unit for cyan image will be described, it being understood that the others may work in a similar fashion.

The process unit 1303 includes a photosensitive drum 1303a rotatable in a direction shown by an arrow. A charging unit 1303b, an exposing unit 1303c, a developing unit 1303d, and a cleaning unit 1303e are disposed to surround the photosensitive drum 1303a, aligned from upstream to downstream with respect to rotation of the photosensitive drum 1303a. The charging unit charges the surface of the photosensitive drum 1303a uniformly. The exposing unit illuminates the charged surface of the photosensitive drum 1303a in accordance with print data to form an electrostatic latent image on the photosensitive drum 1303a. The developing unit supplies toner to the electrostatic latent image to form a cyan toner image. The cleaning unit 1303e removes residual cyan toner after transfer of the cyan toner image. The photosensitive drum and rollers in the process unit are driven in rotation by a drive source and gears (not shown).

A paper cassette 1306 is located at a lower portion of the image forming apparatus 1300, and holds a stack of print medium 1305 such as paper. A hopping roller 1307 is disposed over the paper cassette 1306, and feeds the print medium 1305 into the transport path on a sheet-by-sheet basis.

Registration rollers 1310 and 1311 are disposed downstream of the hopping roller 1307, correct the skew of the print medium 1305, and advance the print medium 1305 in timed relation with image formation in the process unit, while holding the print medium 1305 in sandwiched relation. The hopping roller 1307 and registration rollers 1310 and 1311 are driven in rotation by a drive source and gears (not shown).

Transfer rollers 1312 are formed of, for example, a semiconductive rubber material, and are disposed in parallel to the photosensitive drums in the process units 1301-1304. A high voltage is applied to the transfer rollers 1312 to develop a potential difference between the photosensitive drums and corresponding transfer rollers 1312, thereby transferring the toner image from the photosensitive drum onto the print medium 1305.

A fixing unit 313 includes a heat roller and a pressure roller in contact with the heat roller. The heat roller and pressure roller define a fixing point between them. The toner image is fused into a permanent image. The print medium 1305 is then transferred by discharging rollers 1314 and 1315 and pinch rollers 1316 and 1317 to a stacker 1318, while being held in sandwiched relation between the discharging rollers 1314 and 1315 and pinch rollers 1316 and 1317. The discharging rollers 1314 and 1315 are driven in rotation by a drive source and gears (not shown) in an interlocked manner. The exposing unit 1302e employs the LED print head 1200 of the ninth embodiment.

The operation of the image forming apparatus of the aforementioned configuration will be described. The hopping roller 1307 feeds the print medium 1305 on a page-by-page basis from the paper cassette 1306. The registration rollers 1310 and 1311 cooperate with pinch rollers 1308 and 1309 to hold the print medium in sandwiched relation, transporting the print medium 1305 to the process unit 1301. Then, the recording medium 1305 is transported through the process unit 1301, being held between the photosensitive drum and the transfer roller in sandwiched relation.

The print medium 1305 passes through the process units 1302-1304 in sequence so that electrostatic latent images of the respective colors are formed by corresponding exposing units, developed with toners of corresponding colors, and sequentially transferred onto the recording medium 1350 in registration. As the print medium passes through the fixing unit 1313, the toner images of the respective colors are fused into a full color permanent image. Then, the discharging rollers 1314 and 1315 cooperate with the pinch rollers 1316 and 1317 to discharge the print medium 1305 onto the stacker 1318.

As described above, employing the LED print head of the ninth embodiment provides a small-size, reliable image forming apparatus.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A composite semiconductor device, comprising:
   a semiconductor thin film including a row of light emitting elements extending in a first direction;
   a substrate on which said semiconductor thin film and driver circuits are formed, the driver circuits driving the light emitting elements;
   a row of connection pads formed on said substrate and extending in a second direction substantially parallel to the first direction;
   a plurality of wires electrically connected to the connection pads; and
   a light blocking layer formed in an area between the row of light emitting elements and the row of connection pads, the light blocking layer extending in a third direction along the row of light emitting elements to prevent light emitted from the light emitting elements from travelling in a straight direction to reach portions of the wires furthest from connection points between the wires and the connection pads, the light blocking layer including a plurality of portions that extend in a fourth direction substantially perpendicular to the third direction to define slits between adjacent portions.

2. The composite semiconductor device according to claim 1, wherein an opaque film is formed in an area between said light blocking layer and the light emitting element, the opaque film being opaque to a wavelength of the light emitted from the light emitting element.

3. The composite semiconductor device according to claim 2, wherein the opaque film is formed of a metal material.

4. The composite semiconductor device according to claim 2, wherein the opaque film covers a part of a light emitting region of the light emitting element.

5. The composite semiconductor device according to claim 2, wherein an insulating film is formed under the opaque film.

6. The composite semiconductor device according to claim 5, wherein the insulating film is formed of an organic material.

7. The composite semiconductor device according to claim 1, wherein said light blocking layer is an insulating film.

8. The composite semiconductor device according to claim 7, wherein the insulating film is an organic film.

9. The composite semiconductor device according to claim 1, wherein an opaque film is formed on said light blocking layer, the opaque film being opaque to a wavelength of the light emitted from the light emitting element.

10. The composite semiconductor device according to claim 9, wherein the opaque film is a metal layer.

11. The composite semiconductor device according to claim 1, wherein the semiconductor thin film is connected to an electrode, wherein the electrode is disposed between said light blocking layer and the light emitting element and a part of the electrode extends to block the light emitted from the light emitting element.

12. The composite semiconductor device according to claim 1, wherein said light blocking layer is black.

13. The composite semiconductor device according to claim 1, wherein said semiconductor thin film is a single crystal semiconductor layer.

14. The composite semiconductor device according to claim 1, wherein the plurality of portions of the light blocking layer are in the shape of a comb having fingers extending away from the light emitting portions over electrodes such that the slit is defined between adjacent fingers, the adjacent fingers having a larger width than the slit.

15. The composite semiconductor device according to claim 1, further comprising:
   first conductive contacts and second conductive contacts for the light emitting elements.

16. The composite semiconductor device according to claim 15, wherein a row of the first conductive contacts lies in the row of light emitting elements.

17. The composite semiconductor device according to claim 15, wherein the first conductive contacts are on a side of the light emitting elements opposite said light blocking layer.

18. The composite semiconductor device according to claim 15, wherein the light emitting device elements include first electrodes connected to the first conductive contacts and second electrodes connected to the second conductive contacts, a row of the first electrodes and a row of the second electrodes lie in the row of light emitting portions.

19. The composite semiconductor device according to claim 15, wherein said light blocking layer is formed not to overlap said semiconductor thin film.

20. The composite semiconductor device according to claim 19, wherein a row of the first conductive contacts lies in the row of the light emitting elements.

21. The composite semiconductor device according to claim 19, wherein the light emitting elements include first electrodes connected to the first conductive contacts and second electrodes connected to the second conductive contacts, a row of the first electrodes and a row of the second electrodes lie in a row of the light emitting elements.

22. The composite semiconductor device according to claim 19, wherein the first conductive contacts are on a side of the light emitting elements opposite said light blocking layer.

23. The composite semiconductor device according to claim 1, further comprising:

a smoothing film for smoothing a surface of said substrate, said semiconductor thin film being formed in contact with said smoothing film; and wherein said smoothing film has a thickness greater than 1 µm and equal to or smaller than 2 µm.

24. The composite semiconductor device according to claim 23, wherein said substrate includes a metal layer formed on its surface and said smoothing film covers the metal layer.

25. An LED print head comprises a plurality of semiconductor composite devices according to claim 1, further comprising: a support that supports the plurality of semiconductor composite devices; and a rod lens array that focuses light emitted from the light emitting element on an external object; wherein the light emitting elements are light emitting diodes.

26. An image forming apparatus comprises said LED print head according to claim 25, wherein the image forming apparatus further comprises: an image bearing body; an exposing unit that selectively illuminates a charged surface of said image bearing body to form an electrostatic latent image on the surface; and a developing unit that develops the electrostatic latent image to form a visible image on a print medium.

27. The composite semiconductor device according to claim 1, wherein the second direction is parallel to the first direction and the third direction is parallel to the first direction at least from one endmost light emitting element to another endmost light emitting element.

* * * * *